US012635130B2

(12) United States Patent
Choi et al.

(10) Patent No.: US 12,635,130 B2
(45) Date of Patent: May 19, 2026

(54) SEMICONDUCTOR DEVICE INCLUDING GATE STRUCTURE

(71) Applicant: SAMSUNG ELECTRONICS CO., LTD., Suwon-si (KR)

(72) Inventors: Hyebin Choi, Suwon-si (KR); Chansic Yoon, Anyang-si (KR); Gyuhyun Kil, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 633 days.

(21) Appl. No.: 18/099,302

(22) Filed: Jan. 20, 2023

(65) Prior Publication Data

US 2023/0247826 A1     Aug. 3, 2023

(30) Foreign Application Priority Data

Jan. 28, 2022     (KR) ........................ 10-2022-0013356

(51) Int. Cl.
H10B 12/00          (2023.01)

(52) U.S. Cl.
CPC ............. H10B 12/50 (2023.02); H10B 12/34 (2023.02); H10B 12/482 (2023.02); H10B 12/485 (2023.02)

(58) Field of Classification Search
CPC .... H10B 12/50; H10B 12/482; H10B 12/485; H10B 12/34
See application file for complete search history.

(56)                References Cited

U.S. PATENT DOCUMENTS

| | | | |
|---|---|---|---|
| 8,173,531 | B2 | 5/2012 | Fang et al. |
| 8,524,591 | B2 | 9/2013 | Beyer et al. |
| 9,202,932 | B2 | 12/2015 | Paek et al. |
| 9,431,255 | B2 | 8/2016 | Shin et al. |
| 9,923,076 | B2 * | 3/2018 | Smith ................. H10D 64/021 |
| 10,896,967 | B2 | 1/2021 | Yoon et al. |

(Continued)

FOREIGN PATENT DOCUMENTS

| | | |
|---|---|---|
| KR | 10-2000-0000590 A | 1/2000 |
| KR | 1020140110146 A | 9/2014 |
| KR | 1020150091970 A | 8/2015 |

OTHER PUBLICATIONS

Office Action issued Dec. 21, 2023 for corresponding patent application TW 112102691.

*Primary Examiner* — Richard A Booth
(74) *Attorney, Agent, or Firm* — Muir Patent Law, PLLC

(57)          ABSTRACT

A semiconductor device includes an active region, a gate dielectric layer disposed on the active region, a gate electrode disposed on the gate dielectric layer, a protective layer in contact with a portion of a side surface of the gate electrode, and a spacer structure covering the side surface of the gate electrode and the protective layer. The gate electrode includes a lower conductive pattern disposed on the gate dielectric layer, an intermediate conductive pattern disposed on the lower conductive pattern, and an upper conductive pattern disposed on the intermediate conductive pattern. The protective layer includes a first protective portion in contact with at least a portion of a side surface of the intermediate conductive pattern and a second protective portion in contact with a side surface of the upper conductive pattern, and the second protective portion includes a material different from a material of the first protective portion.

18 Claims, 21 Drawing Sheets

(56) References Cited

U.S. PATENT DOCUMENTS

| | | |
|---|---|---|
| 2005/0081781 A1 | 4/2005 | Lin et al. |
| 2009/0072289 A1* | 3/2009 | Kim .................. H10D 84/0144 |
| | | 257/E29.345 |
| 2010/0109069 A1 | 5/2010 | Yaegashi |
| 2011/0281426 A1 | 11/2011 | Kim et al. |
| 2024/0276703 A1* | 8/2024 | Lee .................. H10B 12/0335 |

* cited by examiner

SEMICONDUCTOR DEVICE INCLUDING GATE STRUCTURE

CROSS-REFERENCE TO RELATED APPLICATION

This application claims the benefit under 35 USC 119(a) of Korean Patent Application No. 10-2022-0013356 filed on Jan. 28, 2022, in the Korean Intellectual Property Office, the entire disclosure of which is incorporated herein by reference for all purposes.

BACKGROUND

1. Field

Embodiments relate to a semiconductor device including a gate structure, and a method of manufacturing the same.

2. Description of the Related Art

Research on decreasing sizes of elements constituting a semiconductor device and improving performance of the elements is in progress. For example, in a dynamic random access memory (DRAM), research into technology for reliably and stably forming elements with decreased sizes is in progress.

SUMMARY

According to example embodiments, a semiconductor device may include an active region, a gate dielectric layer disposed on the active region, a gate electrode disposed on the gate dielectric layer, a protective layer in contact with a portion of a side surface of the gate electrode, and a spacer structure covering the side surface of the gate electrode and the protective layer. The gate electrode includes a lower conductive pattern disposed on the gate dielectric layer, an intermediate conductive pattern disposed on the lower conductive pattern, and an upper conductive pattern disposed on the intermediate conductive pattern. The protective layer includes a first protective portion in contact with at least a portion of a side surface of the intermediate conductive pattern and a second protective portion in contact with a side surface of the upper conductive pattern, and the second protective portion includes a material different from a material of the first protective portion.

According to example embodiments, a semiconductor device may include a substrate, an isolation layer defining a first active region and a second active region on the substrate, a first gate dielectric layer disposed on the first active region, a second gate dielectric layer disposed on the second active region, a first gate electrode disposed on the first gate dielectric layer, a second gate electrode disposed on the second gate dielectric layer, a first source/drain region disposed in the first active region on at least one side of the first gate electrode and having N-type conductivity, a second source/drain region disposed in the second active region on at least one side of the second gate electrode and having P-type conductivity, an N-channel metal oxide semiconductor (NMOS) gate protective layer in contact with a portion of a side surface of the first gate electrode, a P-channel metal oxide semiconductor (PMOS) gate protective layer in contact with a portion of a side surface of the second gate electrode, a first spacer structure covering the side surface of the first gate electrode and the NMOS gate protective layer, and a second spacer structure covering the side surface of the second gate electrode and the PMOS gate protective layer. The first gate electrode includes a first lower conductive pattern disposed on the first gate dielectric layer, a first intermediate conductive pattern disposed on the first lower conductive pattern, and a first upper conductive pattern disposed on the first intermediate conductive pattern. The second gate electrode includes a second lower conductive pattern disposed on the second gate dielectric layer, a second intermediate conductive pattern disposed on the second lower conductive pattern, and a second upper conductive pattern disposed on the second intermediate conductive pattern. The NMOS gate protective layer includes a first NMOS protective portion in contact with at least a portion of a side surface of the first intermediate conductive pattern and a second NMOS protective portion in contact with a side surface of the first upper conductive pattern, the PMOS gate protective layer includes a first PMOS protective portion in contact with at least a portion of a side surface of the second intermediate conductive pattern and a second PMOS protective portion in contact with a side surface of the second upper conductive pattern, the first lower conductive pattern includes an NMOS work function control layer, the second lower conductive pattern includes a PMOS work function control layer different from the NMOS work function control layer, the first intermediate conductive pattern and the second intermediate conductive pattern include a polysilicon layer, the first upper conductive pattern and the second upper conductive pattern include the same metal layer, and a material of the first NMOS protective portion and the first PMOS protective portion is different from a material of the second NMOS protective portion and the second PMOS protective portion.

According to example embodiments, a semiconductor device may include a substrate, an isolation layer defining a cell active region on a memory cell area of the substrate and defining a peripheral active region on a peripheral circuit area of the substrate, a cell gate structure buried in the cell active region and extending into the isolation layer, a bit line structure disposed on the cell active region and the isolation layer and electrically connected to a first cell source/drain region in the cell active region, a cell contact structure disposed on the cell active region and electrically connected to a second cell source/drain region in the cell active region, a peripheral gate dielectric layer disposed on the peripheral active region, a peripheral gate electrode disposed on the peripheral gate dielectric layer, a peripheral gate capping pattern disposed on the peripheral gate electrode, a peripheral source/drain region disposed in the peripheral active region on at least one side of the peripheral gate electrode, a protective layer in contact with at least a portion of a side surface of the peripheral gate electrode, a peripheral spacer structure covering the side surface of the peripheral gate electrode and the protective layer, and a peripheral contact structure disposed on the peripheral source/drain region. The peripheral gate electrode includes a peripheral lower conductive pattern disposed on the peripheral gate dielectric layer, a peripheral intermediate conductive pattern disposed on the peripheral lower conductive pattern, and a peripheral upper conductive pattern disposed on the peripheral intermediate conductive pattern. The protective layer includes a first protective portion in contact with at least a portion of a side surface of the peripheral intermediate conductive pattern and a second protective portion in contact with a side surface of the peripheral upper conductive pattern, and the second protective portion includes a material different from a material of the first protective portion.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, the terms such as "upper", "intermediate", and "lower" may be replaced with other terms such as "first", "second", and "third" and be used to describe elements of the present specification. The terms such as "first", "second", and "third" may be used to describe various elements, but these elements are not limited by these terms, and a "first element" may also be referred to as a "second element".

Figure 1:
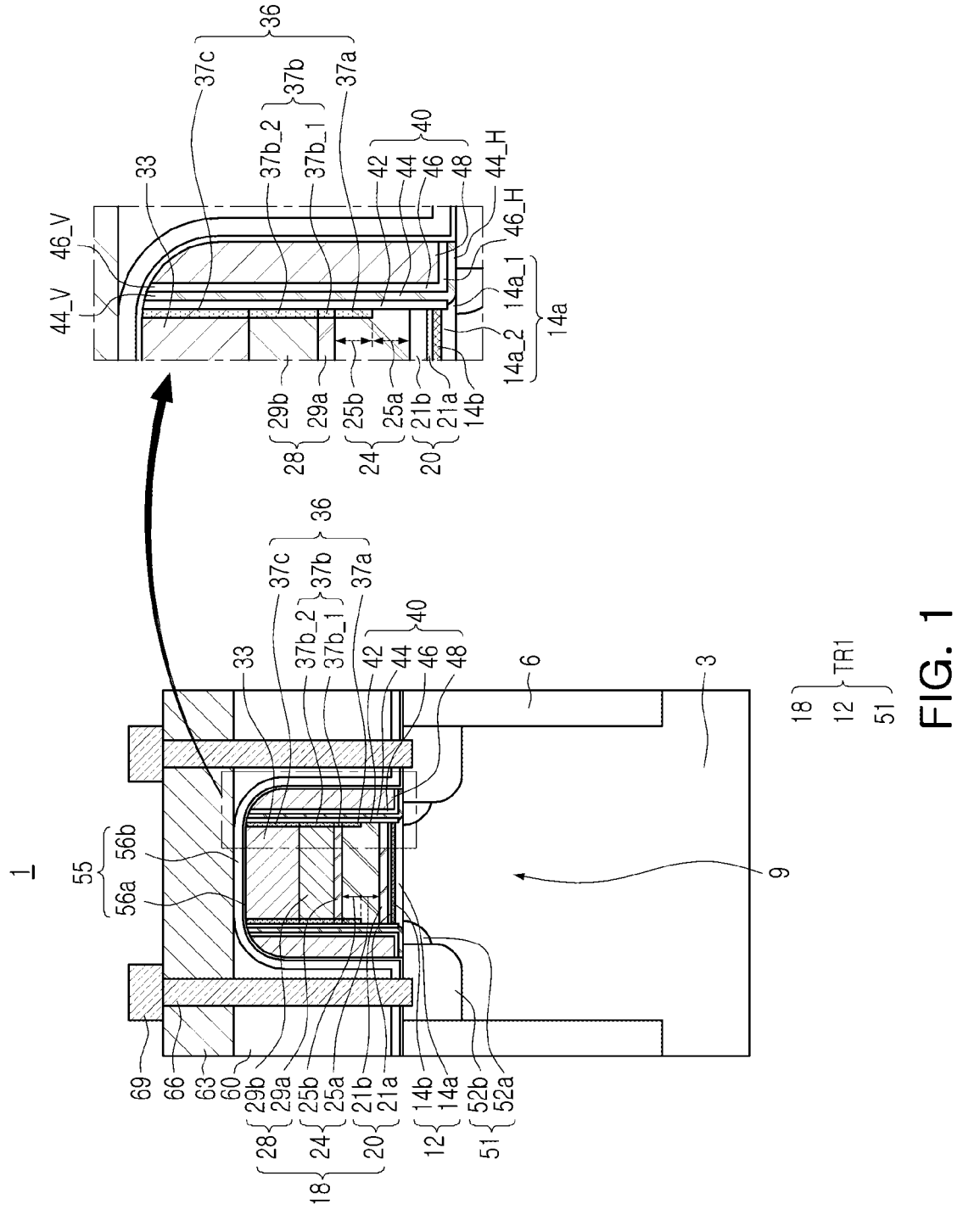
FIG. 1 is a schematic cross-sectional view of a semiconductor device according to an example embodiment.

First, an example of a semiconductor device according to an example embodiment will be described with reference to FIG. 1. FIG. 1 is a schematic cross-sectional view of a semiconductor device according to an example embodiment.

Referring to FIG. 1, a semiconductor device 1 according to an example embodiment may include a substrate 3, an active region 9 disposed on the substrate 3, and an isolation layer 6 defining the active region 9 on the substrate 3.

The substrate 3 may be a semiconductor substrate. For example, the substrate 3 may include a semiconductor material, e.g., a group IV semiconductor, a group III-V compound semiconductor, or a group II-VI compound semiconductor. For example, the group IV semiconductor may include silicon, germanium, or silicon-germanium. The substrate 3 may also be provided as, e.g., a bulk semiconductor wafer, a semiconductor substrate including an epitaxial layer, a silicon on insulator (SOI) substrate, a semiconductor on insulator (SeOI) substrate, or the like.

The active region 9 may have a shape in which it protrudes from the substrate 3 in a vertical direction. Accordingly, the active region 9 may be formed of the same material as the substrate 3, e.g., a semiconductor material.

The isolation layer 6 may be formed by shallow trench isolation. The isolation layer 6 may be formed of an insulating material, e.g., a silicon oxide and/or a silicon nitride.

The semiconductor device 1 may further include a gate dielectric pattern 12 disposed on the active region 9, a gate electrode 18 disposed on the gate dielectric pattern 12, a protective layer 36 in contact with at least a portion of a side surface of the gate electrode 18, and a spacer structure 40 covering the side surface of the gate electrode 18 and the protective layer 36. The semiconductor device 1 may further include a gate capping pattern 33 disposed on the gate electrode 18.

The semiconductor device 1 may further include source/drain regions 51 disposed in the active region 9. The source/drain regions 51 may be disposed in the active region 9 adjacent to at least one side, e.g., both sides, of the gate electrode 18.

Each of the source/drain regions 51 may include a low-concentration impurity region 52a and a high-concentration impurity region 52b. The low-concentration impurity region 52a may have a shallow depth, and the high-concentration impurity region 52b may have a deep depth. A portion of the low-concentration impurity region 52a may vertically overlap the gate dielectric pattern 12 and the gate electrode 18. The high-concentration impurity region 52 may not vertically overlap the gate dielectric pattern 12 and the gate electrode 18. The source/drain regions 51 with the gate dielectric pattern 12 and the gate electrode 18 may constitute a transistor TR1.

The gate dielectric pattern 12 may be disposed on the active region 9 between the source/drain regions 51. The gate dielectric pattern 12 may include a lower dielectric layer 14a and an upper dielectric layer 14b disposed on the lower dielectric layer 14a.

The lower dielectric layer 14a may include a silicon oxide or a Si-based dielectric. The upper dielectric layer 14b may include a high-κ dielectric having a greater dielectric constant than the silicon oxide. For example, the upper dielectric layer 14b may include at least one of a hafnium oxide (HfO), a hafnium (Hf)-based oxide, an aluminum oxide (AlO), an aluminum (Al)-based oxide, a lanthanum oxide (LaO), a lanthanum (La)-based oxide, a magnesium oxide (MgO), and a magnesium (Mg)-based oxide. The lower dielectric layer 14a may be thicker than the upper dielectric layer 14b, e.g., in the vertical direction that is perpendicular to the upper surface of the substrate 3.

The gate electrode 18 may include a lower conductive pattern 20 disposed on the gate dielectric pattern 12, an intermediate conductive pattern 24 disposed on the lower conductive pattern 20, and an upper conductive pattern 28 disposed on the intermediate conductive pattern 24. The intermediate conductive pattern 24 may be between the lower conductive pattern 20 and the upper conductive pattern 28.

In an example, the transistor TR1 may be an N-channel metal oxide semiconductor (NMOS) transistor. In another example, the transistor TR1 may be a P-channel metal oxide semiconductor (PMOS) transistor.

The lower conductive pattern 20 may be a work function control layer including a first conductive material. For example, the lower conductive pattern 20 may be an NMOS work function control layer formed of a conductive material capable of adjusting or controlling a threshold voltage of the NMOS transistor or a PMOS work function control layer formed of a conductive material capable of adjusting or controlling a threshold voltage of the PMOS transistor, depending on a type of the transistor TR1.

For example, the lower conductive pattern 20 may include at least one of TiN, TiAl, TiAlC, TiAlN, TaN, TaAlC, and TaAlN. By controlling an amount of a metal element of at least one of TiN, TiAl, TiAlC, TiAlN, TaN, TaAlC and TaAlN in the lower conductive pattern 20, the lower conductive pattern 20 may serve as an NMOS work function control layer or a PMOS work function control layer.

The lower conductive pattern 20 may include at least two conductive layers. For example, the lower conductive pattern 20 may include a first lower conductive layer 21a and a second lower conductive layer 21b disposed on the first lower conductive layer 21a. For example, the first lower conductive layer 21a may include a rare earth metal element (e.g., La), and the second lower conductive layer 21b may include at least one of TiN, TiAl, TiAlC, TiAlN, TaN, TaAlC, and TaAlN.

The intermediate conductive pattern 24 may be formed of a material different from that of the lower conductive pattern 20. For example, the intermediate conductive pattern 24 may include polysilicon. For example, the intermediate conductive pattern 24 may be formed of doped polysilicon. For example, the intermediate conductive pattern 24 may be formed of polysilicon having N-type conductivity.

In an example, when the transistor TR1 is a PMOS transistor, the transistor TR1 may include the lower conductive pattern 20 which may be a PMOS work function control layer, and thus, the intermediate conductive pattern 24 may be formed of polysilicon having N-type conductivity instead of polysilicon having P-type conductivity. Accordingly, electrical characteristics of the gate electrode 18 may be improved without deteriorating performance of the transistor TR1.

The upper conductive pattern 28 may include a material different from the material of the lower conductive pattern 20 and the material of the intermediate conductive pattern 24. The upper conductive pattern 28 may include at least two conductive layers. For example, the upper conductive pattern 28 may include a first upper conductive layer 29a and a second upper conductive layer 29b disposed on the first upper conductive layer 29a. The first upper conductive layer 29a may include, e.g., a titanium silicon nitride (TiSiN) layer. The second upper conductive layer 29b may include, e.g., a tungsten (W) layer.

The gate capping pattern 33 may be positioned on the upper conductive pattern 28. The gate capping pattern 33 may include an insulating material, e.g., a silicon nitride.

The protective layer 36 may include a first protective portion 37a in contact with at least a portion of a side surface of the intermediate conductive pattern 24 and a second protective portion 37b in contact with a side surface of the upper conductive pattern 28. The protective layer 36 may further include a third protective portion 37c in contact with a side surface of the gate capping pattern 33.

The second protective portion 37b may include a material different from that of the first protective portion 37a. For example, when the first protective portion 37a includes a silicon nitride, the second protective portion 37b may include a metal nitride different from the silicon nitride. In another example, when the first protective portion 37a includes a silicon oxide, the second protective portion 37b may include a metal oxide different from the silicon oxide, a metal nitride, or a metal oxynitride. Accordingly, the protective layer 36 may include at least one of an oxide, a nitride, and an oxynitride.

In an example embodiment, the protective layer 36 may include a nitride. For example, the protective layer 36 may include a nitride formed by nitriding a portion of the side surface of the gate electrode 18 and the side surface of the gate capping pattern 33. When the protective layer 36 includes the nitride, the first protective portion 37a may include a first nitride formed by nitriding the side surface of the intermediate conductive pattern 24, the second protective portion 37b may include a first portion 37b_1 including a second nitride formed by nitriding a side surface of the first upper conductive layer 29a and in contact with the side surface of the first upper conductive layer 29a, and a second portion 37b_2 including a third nitride formed by nitriding a side surface of the second upper conductive layer 29b and in contact with the side surface of the second upper conductive layer 29b, and the third protective portion 37c may include a fourth nitride formed by nitriding the side surface of the gate capping pattern 33. When the intermediate conductive pattern 24 is formed of polysilicon, the first nitride of the first protective portion 37a may be a silicon nitride. When the first upper conductive layer 29a is formed of TiSiN, the second nitride of the first portion 37b_1 of the second protective portion 37b may be TiSiN in which a concentration of N is higher than that in TiSiN of the first upper conductive layer 29a. When the second upper conductive layer 29b is formed of W, the third nitride of the second portion 37b_2 of the second protective portion 37b may be tungsten nitride (WN). When the gate capping pattern 33 is formed of SiN, the fourth nitride of the third protective portion 37c may be SiN in which a concentration of N is higher than that in SiN of the gate capping pattern 33.

In another example embodiment, the protective layer 36 may include an oxide. For example, the protective layer 36 may include an oxide formed by oxidizing a portion of the side surface of the gate electrode 18 and the side surface of the gate capping pattern 33, e.g., the protective layer 36 may include oxidized portions of the side surfaces of the gate electrode 18 and the gate capping pattern 33. When the protective layer 36 includes the oxide, the first protective portion 37a may include a first oxide formed by oxidizing the side surface of the intermediate conductive pattern 24, the second protective portion 37b may include a first portion 37b_1 including a second oxide formed by oxidizing a side surface of the first upper conductive layer 29a and in contact with the side surface of the first upper conductive layer 29a, and a second portion 37b_2 including a third oxide formed by oxidizing a side surface of the second upper conductive layer 29b and in contact with the side surface of the second upper conductive layer 29b, and the third protective portion 37c may include a fourth oxide formed by oxidizing the side surface of the gate capping pattern 33. When the intermediate conductive pattern 24 is formed of polysilicon, the first oxide of the first protective portion 37a may be a silicon oxide. When the first upper conductive layer 29a is formed of TiSiN, the second oxide of the first portion 37b_1 of the second protective portion 37b may be TiSiON. When the second upper conductive layer 29b is formed of W, the third oxide of the second portion 37b_2 of the second protective portion 37b may be tungsten oxide (WO). When the gate capping pattern 33 is formed of SiN, the fourth oxide of the third protective portion 37c may be SiON.

In another example embodiment, the protective layer 36 may include an oxide and a nitride. When the protective layer 36 includes the oxide and the nitride, the first protective portion 37a may include an oxide formed by oxidizing the side surface of the intermediate conductive pattern 24, the second protective portion 37b may include a first portion 37b_1 including a nitride formed by nitriding a side surface of the first upper conductive layer 29a and a second portion 37b_2 including a nitride formed by nitriding a side surface of the second upper conductive layer 29b, and the third protective portion 37c may include an oxide formed by oxidizing the side surface of the gate capping pattern 33. When the intermediate conductive pattern 24 is formed of polysilicon, the oxide of the first protective portion 37a may be a silicon oxide. When the first upper conductive layer 29a is formed of TiSiN, the nitride of the first portion 37b_1 of the second protective portion 37b may be TiSiN in which a concentration of N is higher than that in TiSiN of the first upper conductive layer 29a. When the second upper conductive layer 29b is formed of W, the nitride of the second portion 37b_2 of the second protective portion 37b may be WN. When the gate capping pattern 33 is formed of SiN, the oxide of the third protective portion 37c may be SiON.

In another example embodiment, the protective layer 36 may include an oxide and an oxynitride. When the protective layer 36 includes the oxide and the oxynitride, the first protective portion 37a may include an oxide formed by oxidizing the side surface of the intermediate conductive pattern 24, the second protective portion 37b may include a first portion 37b_1 including an oxynitride formed by nitriding and oxidizing a side surface of the first upper conductive layer 29a and a second portion 37b_2 including an oxynitride formed by nitriding and oxidizing a side surface of the second upper conductive layer 29b, and the third protective portion 37c may include an oxynitride formed by nitriding and oxidizing the side surface of the gate capping pattern 33. When the intermediate conductive pattern 24 is formed of polysilicon, the oxide of the first protective portion 37a may be a silicon oxide. When the first upper conductive layer 29a is formed of TiSiN, the oxynitride of the first portion 37b_1 of the second protective portion 37b may be titanium silicon oxynitride (TiSiON). When the second upper conductive layer 29b is formed of W, the oxynitride of the second portion 37b_2 of the second protective portion 37b may be WON. When the gate capping pattern 33 is formed of SiN, the oxynitride of the third protective portion 37c may be SiON.

In another example embodiment, when the intermediate conductive pattern 24 is formed of polysilicon, the first protective portion 37a may include a silicon oxynitride.

The intermediate conductive pattern 24 may include a first intermediate portion 25a and a second intermediate portion 25b disposed on the first intermediate portion 25a. A side surface of the first intermediate portion 25a may be in contact with the spacer structure 40, and a side surface of the second intermediate portion 25b may be in contact with the first protective portion 37a of the protective layer 36.

The first intermediate portion 25a may have a greater width than the second intermediate portion 25b, e.g., along a horizontal direction parallel to the upper surface of the substrate 3. As such, the first protective portion 37a of the protective layer 36 may vertically overlap the first interme-diate portion 25a, e.g., the first protective portion 37a of the protective layer 36 may vertically overlap an edge of the first intermediate portion 25a that protrudes horizontally beyond the second intermediate portion 25b. The first intermediate portion 25a may have a vertical thickness that is substantially the same as that of the second intermediate portion 25b, e.g., along the vertical direction.

The spacer structure 40 may cover the side surface of the gate electrode 18, the side surface of the gate capping pattern 33, and the protective layer 36. The spacer structure 40 may include a plurality of spacer layers. For example, the spacer structure 40 may include a first spacer layer 42, a second spacer layer 44 disposed on the first spacer layer 42, a third spacer layer 46 disposed on the second spacer layer 44, and a fourth spacer layer 48 disposed on the third spacer layer 46.

Materials of the first and third spacer layers 42 and 46 may be different from those of the second and fourth spacer layers 44 and 48. For example, the first and third spacer layers 42 and 46 may include a nitride or a nitride-based first insulating material, and the second and fourth spacer layers 44 and 48 may include an oxide or an oxide-based second insulating material. For example, the first insulating material may include a silicon nitride, and the second insulating material may include a silicon oxide.

The first spacer layer 42 may be in, e.g., direct, contact with the protective layer 36 and may cover a side surface of the gate electrode 18.

A lower end of the first spacer layer 42 may be positioned on a higher level than a lower surface of the lower dielectric layer 14a, e.g., relative to the lower surface of the substrate 3, and may be positioned on a level lower than an upper surface of the lower dielectric layer 14a, e.g., relative to the lower surface of the substrate 3. That is, the lower end of the first spacer layer 42 may extend into the lower dielectric layer 14a to be between upper and lower surfaces thereof.

The lower dielectric layer 14a may include a first portion 14a_1 and a second portion 14a_2. The first portion 14a_1 may be disposed on a level lower than the first spacer layer 42, may extend below a lower surface of the first spacer layer 42, and may be in contact with the second spacer layer 44. The second portion 14a_2 may be disposed on the first portion 14a_1.

The second spacer layer 44 may include a first vertical portion 44_V in contact with the first spacer layer 42 and a first horizontal portion 44_H extending from a lower end portion of the first vertical portion 44_V. For example, the second spacer layer 44 may have an L-shaped cross-section on each side of the gate electrode 18.

The third spacer layer 46 may include a second vertical portion 46_V in contact with the first vertical portion 44_V and a second horizontal portion 46_H extending from a lower end portion of the second vertical portion 46_V and in contact with the first horizontal portion 44_H. For example, the third spacer layer 46 may have an L-shaped cross-section on each side of the gate electrode 18.

The fourth spacer layer 48 may be in contact with the second horizontal portion 46_H and the second vertical portion 46_V on the second horizontal portion 46_H.

The semiconductor device 1 may further include an insulating liner 55 covering the spacer structure 40 and the gate capping pattern 33, and covering the source/drain regions 51 and the isolation layer 6. An interlayer insulating layer 60 may be disposed on the insulating liner 55, and an upper capping insulating layer 63 may be disposed on the insulating liner 55 and the interlayer insulating layer 60.

The insulating liner 55 may be formed as a single layer or multiple layers. For example, the insulating liner 55 may include a buffer oxide layer 56*a* formed of an oxide-based material and a liner layer 56*b* disposed on the buffer oxide layer 56*a* and having a greater thickness than the buffer oxide layer 56*a*. The buffer oxide layer 56*a* may be formed of an insulating material, e.g., a silicon oxide, and the liner layer 56*b* may be formed of an insulating material, e.g., a silicon nitride. In another example, the buffer oxide layer 56*a* may be omitted.

The interlayer insulating layer 60 may be disposed on the insulating liner 55, and may have an upper surface coplanar with an upper surface of the insulating liner 55. For example, the interlayer insulating layer 60 may be disposed on a portion of the insulating liner 55 covering the spacer structure 40, the source/drain regions 51, and the isolation layer 6. The interlayer insulating layer 60 may be formed of a low-κ dielectric having a smaller dielectric constant than a silicon oxide or a silicon oxide.

The upper capping insulating layer 63 may include a material different from that of the interlayer insulating layer 60, e.g., silicon nitride. The semiconductor device 1 may further include contact structures 66 sequentially penetrating through the upper capping insulating layer 63, the interlayer insulating layer 60, and the insulating liner 55 and electrically connected to the source/drain regions 51. Wiring patterns 69 disposed on the contact structures 66.

Various modified examples of the elements of the semiconductor device 1 described above will hereinafter be described with reference to FIGS. 2 to 5, respectively. In various modified examples of the elements of the semiconductor device 1 described above, modified elements or replaced elements will be mainly described below. In addition, elements that may be modified or replaced to be described below will be described with reference to the respective drawings, but elements that may be modified may be combined with each other to configure a semiconductor device 1 according to an example embodiment. FIGS. 2 to 5 are schematic cross-sectional views for describing various modified examples of the elements of the semiconductor device 1 described above.

In a modified example, referring to FIG. 2, the intermediate conductive pattern 24 including the first intermediate portion 25*a* and the second intermediate portion 25*b* that have substantially the same thickness as described with reference to FIG. 1 may be modified into an intermediate conductive pattern 24*a* including a first intermediate portion 25*a*1 and a second intermediate portion 25*b*1 that have different thicknesses in the vertical direction. In the intermediate conductive pattern 24*a*, the first intermediate portion 25*a*1 may have a greater thickness than the second intermediate portion 25*b*1. For example, in the intermediate conductive pattern 24*a*, the first intermediate portion 25*a*1 may have a thickness about 1.5 or more times greater than the thickness of the second intermediate portion 25*b*1. The first protective portion 37*a* (see FIG. 1) of the protective layer 36 described with reference to FIG. 1 may be modified into a first protective portion 37*a*1 in contact with a side surface of the second intermediate portion 25*b*1.

In a modified example, referring to FIG. 3, the intermediate conductive pattern 24 including the first intermediate portion 25*a* and the second intermediate portion 25*b* that have substantially the same thickness as described with reference to FIG. 1 may be modified into an intermediate conductive pattern 24*b* including a first intermediate portion 25*a*2 and a second intermediate portion 25*b*2 having a greater thickness than the first intermediate portion 25*a*2 in the vertical direction. In the intermediate conductive pattern 24*b*, the first intermediate portion 25*a*2 may have a thickness about 1.5 or more times smaller than a thickness of the second intermediate portion 25*b*2. The first protective portion 37*a* (see FIG. 1) of the protective layer 36 described with reference to FIG. 1 may be modified into a first protective portion 37*a*2 in contact with a side surface of the second intermediate portion 25*b*2.

Figure 4:
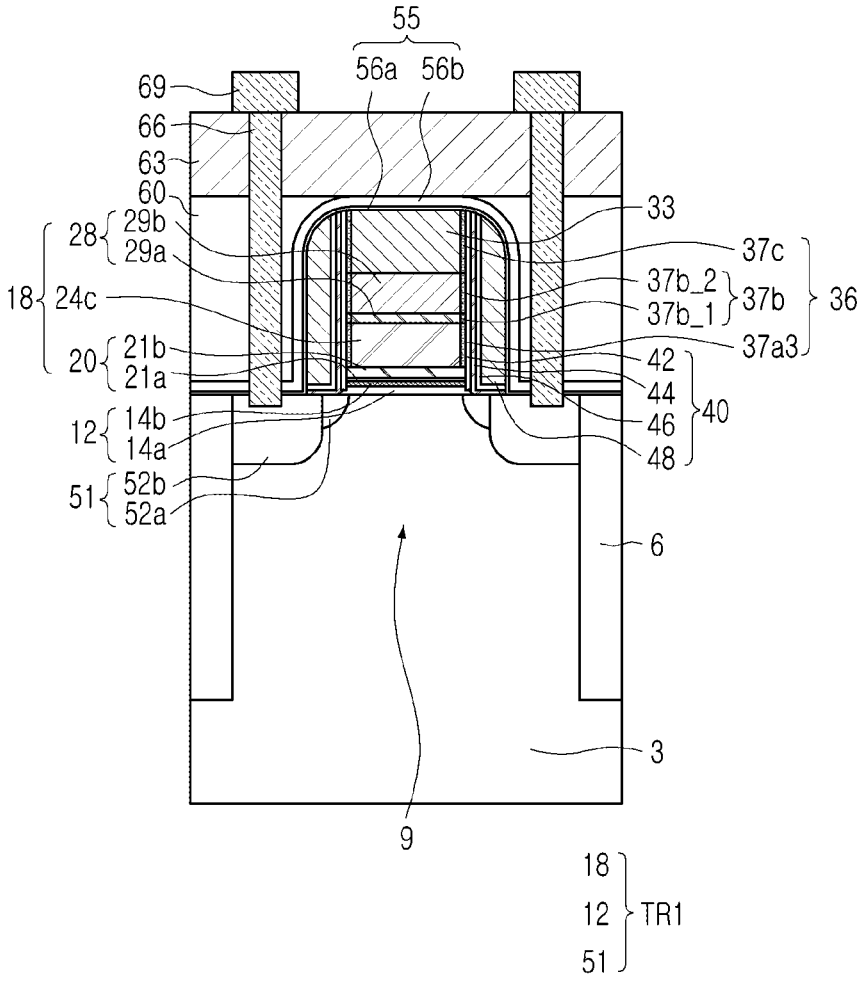
FIG. 4 is a schematic cross-sectional view of yet another modified semiconductor device according to an example embodiment.

In a modified example, referring to FIG. 4, the intermediate conductive pattern 24 including the first intermediate portion 25*a* and the second intermediate portion 25*b* having the smaller width than the first intermediate portion 25*a* as described with reference to FIG. 1 may be modified into an intermediate conductive pattern 24*c* having substantially the same width. For example, the intermediate conductive pattern 24 (see FIG. 1) described with reference to FIG. 1 may have a side surface having a step generated by the first and second intermediate portions 25*a* and 25*b* having different widths, while the intermediate conductive pattern 24*c* as illustrated in FIG. 4 may have a substantially vertical side surface without a step. The first protective portion 37*a* (see FIG. 1) of the protective layer 36 described with reference to FIG. 1 may be modified into a first protective portion 37*a*3 in contact with an entire side surface of the intermediate conductive pattern 24*c*.

Figure 5:
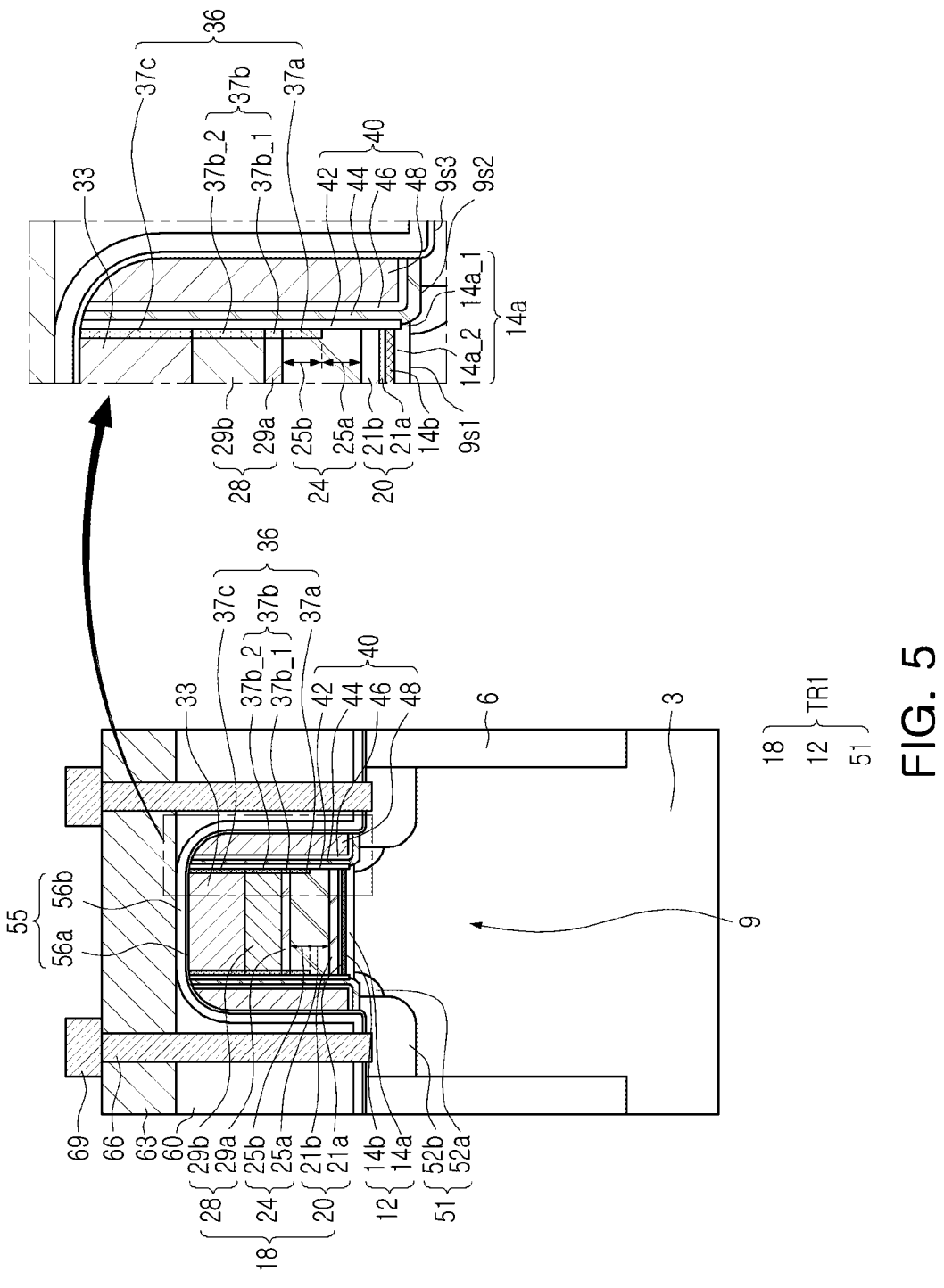
FIG. 5 is a schematic cross-sectional view of still another modified semiconductor device according to an example embodiment.

In a modified example, referring to FIG. 5, an upper surface of the active region 9 in FIGS. 1 to 4 may be substantially flat, but example embodiments are not limited thereto. For example, the flat upper surface of the active region 9 in FIGS. 1 to 4 may be modified into an upper surface including a first surface 9*s*1 positioned below the gate electrode 18, a second surface 9*s*2 positioned on a level lower than the first surface 9*s*1 below the spacer structure 40, and a third surface 9*s*3 positioned below the insulating liner 55 and the interlayer insulating layer 60 outside the spacer structure 40 and positioned on a level lower than the second surface 9*s*2. In an example embodiment, a boundary between the first surface 9*s*1 and the second surface 9*s*2 may be positioned below the first spacer layer 42. The contact structures 66 may penetrate through the third surface 9*s*3 and extend into the high-concentration impurity regions 52*b* of the source/drain regions 51.

Figure 6:
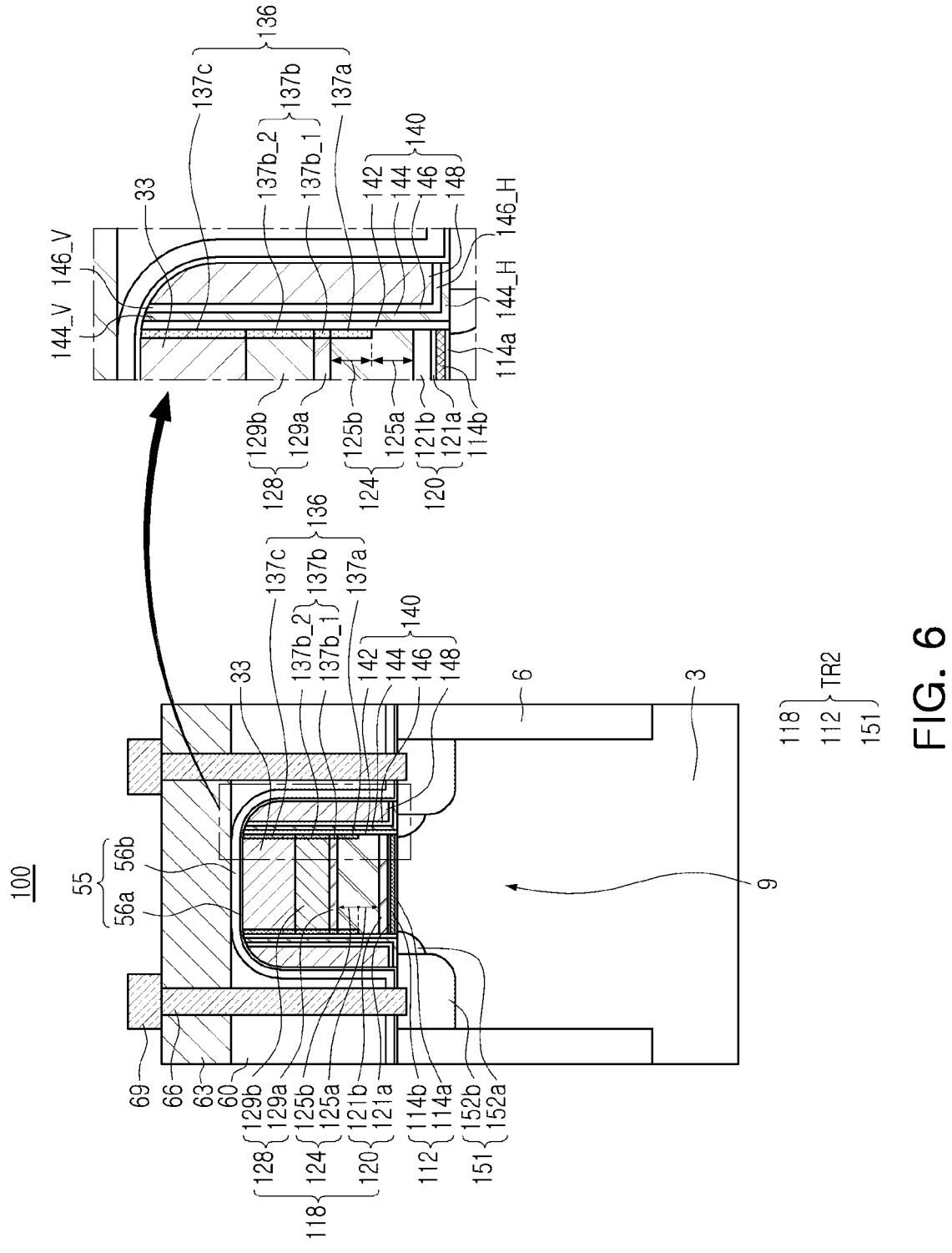
FIG. 6 is a schematic cross-sectional view of yet another modified semiconductor device according to an example embodiment.

Next, a modified example of a semiconductor device according to an example embodiment will be described with reference to FIG. 6. FIG. 6 is a schematic cross-sectional view illustrating a semiconductor device according to an example embodiment.

In a modified example, referring to FIG. 6, a semiconductor device 100 according to an example embodiment may include the substrate 3, the active region 9, the isolation layer 6, the gate capping pattern 33, the insulating liner 55, the upper capping insulating layer 63, the contact structures 66, and the wiring patterns 69, as described with reference to FIG. 1. The semiconductor device 100 according to an example embodiment may further include source/drain regions 151 disposed in the active region 9, a gate dielectric pattern 112 disposed on the active region 9, a gate electrode 118 disposed on the gate dielectric pattern 112, a protective layer 136 in contact with at least a portion of a side surface of the gate electrode 118, and a spacer structure 140 covering the side surface of the gate electrode 118 and the protective layer 136.

The source/drain regions 151, the gate dielectric pattern 112, and the gate electrode 118 may constitute a transistor TR2. The transistor TR2 may be an NMOS transistor or a PMOS transistor like the transistor TR1 described with reference to FIG. 1.

The source/drain regions 151 may be disposed in the active region 9 adjacent to at least one side, e.g., both sides of, the gate electrode 118, and may include a low-concentration impurity region 152a and a high-concentration impurity region 152b that may respectively correspond to the low-concentration impurity region 52a and the high-concentration impurity region 52b in FIG. 1. Throughout the detailed description, an expression "A may include C that may correspond to B" may mean that "in A, C may be formed in substantially the same structure as B and/or be formed of substantially the same material as B".

The gate dielectric pattern 112 may include a lower dielectric layer 114a and an upper dielectric layer 114b disposed on the lower dielectric layer 114a. The lower dielectric layer 114a may include a silicon oxide or a Si-based dielectric, and the upper dielectric layer 114b may include a high-κ dielectric having a greater dielectric constant than the silicon oxide. The lower dielectric layer 114a may have a smaller thickness than the upper dielectric layer 114b in the vertical direction.

The gate electrode 118 may include a lower conductive pattern 120, an intermediate conductive pattern 124, and an upper conductive pattern 128 that may respectively correspond to the lower conductive pattern 20, the intermediate conductive pattern 24, and the upper conductive pattern 28 described with reference to FIG. 1. For example, the lower conductive pattern 120 may include a first lower conductive layer 121a and a second lower conductive layer 121b that may respectively correspond to the first lower conductive layer 21a and the second lower conductive layer 21b described with reference to FIG. 1. The upper conductive pattern 128 may include a first upper conductive layer 129a and a second upper conductive layer 129b that may respectively correspond to the first upper conductive layer 29a and the second upper conductive layer 29b described with reference to FIG. 1.

The protective layer 136 may include a first protective portion 137a in contact with at least a portion of a side surface of the intermediate conductive pattern 124, a second protective portion 137b in contact with a side surface of the upper conductive pattern 128, and a third portion 137c in contact with a side surface of the gate capping pattern 33. The second protective portion 137b may include a material different from that of the first protective portion 137a.

The protective layer 136 may be substantially the same as the protective layer 36 described with reference to FIG. 1. For example, in the protective layer 136, the first to third protective portions 137a, 137b, and 137c may correspond to the first to third protective portions 37a, 37b and 37c described with reference to FIG. 1, respectively. For example, the second protective portion 137b may include a first portion 137b_1 formed by nitriding or oxidizing a side surface of the first upper conductive layer 129a and a second portion 137b_2 formed by nitriding or oxidizing a side surface of the second upper conductive layer 129b, like the second protective portion 37b described with reference to FIG. 1.

The intermediate conductive pattern 124 may include a first intermediate portion 125a and a second intermediate portion 125b disposed on the first intermediate portion 125a. A side surface of the first intermediate portion 125a may be in contact with the spacer structure 140, and a side surface of the second intermediate portion 125b may be in contact with the first protective portion 137a of the protective layer 136.

The first intermediate portion 125a may have a greater width than the second intermediate portion 125b. For example, the first intermediate portion 125a may have a vertical thickness that is substantially the same as that of the second intermediate portion 125b, like the first intermediate portion 25a in FIG. 1. In another example, the first intermediate portion 125a may be modified to have a greater vertical thickness than the second intermediate portion 125b, like the first intermediate portion 25a1 in FIG. 2. In yet another example, the first intermediate portion 125a may be modified to have a smaller vertical thickness than the second intermediate portion 125b, like the first intermediate portion 25a2 in FIG. 3.

The spacer structure 140 may cover the side surface of the gate electrode 118, the side surface of the gate capping pattern 33, and the protective layer 136. The spacer structure 140 may include a plurality of spacer layers. For example, the spacer structure 140 may include a first spacer layer 142 covering a side surface of the gate dielectric pattern 112, the side surface of the gate electrode 118, the side surface of the gate capping pattern 33, and the protective layer 136, a second spacer layer 144 disposed on the first spacer layer 142, a third spacer layer 146 disposed on the second spacer layer 144, and a fourth spacer layer 148 disposed on the third spacer layer 146.

Materials of the first and third spacer layers 142 and 146 may be different from those of the second and fourth spacer layers 144 and 148. For example, the first and third spacer layers 142 and 146 may include a nitride or a nitride-based first insulating material, and the second and fourth spacer layers 144 and 148 may include an oxide or an oxide-based second insulating material. For example, the first insulating material may include a silicon nitride, and the second insulating material may include a silicon oxide.

A lower end of the first spacer layer 142 may be positioned on the same height level as a lower end of the gate dielectric pattern 112 or a level lower than the lower end of the gate dielectric pattern 112. The second spacer layer 144 may include a first vertical portion 144_V in contact with the first spacer layer 142 and a first horizontal portion 144_H extending from a lower end portion of the first vertical portion 144_V. The third spacer layer 146 may include a second vertical portion 146_V in contact with the first vertical portion 144_V and a second horizontal portion 146_H extending from a lower end portion of the second vertical portion 146_V and in contact with the first horizontal portion 144_H. The fourth spacer layer 148 may be in contact with the second horizontal portion 146_H and the second vertical portion 146_V on the second horizontal portion 146_H.

Figure 7:
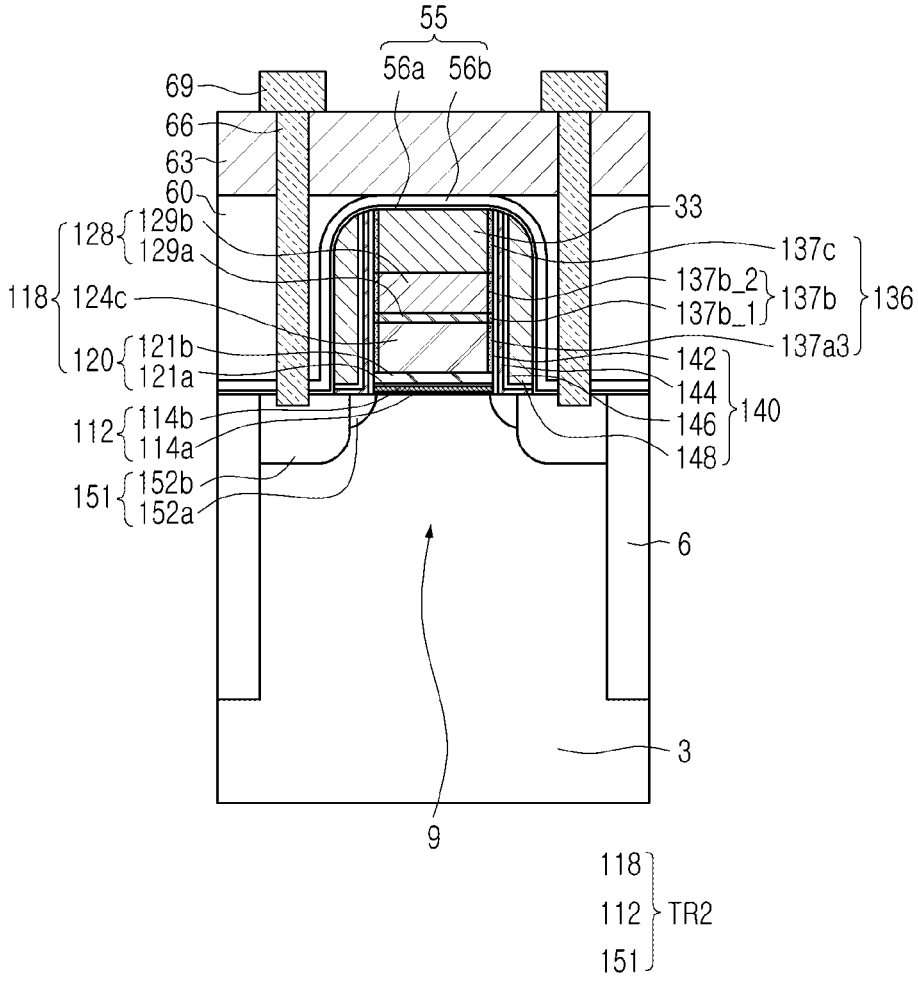
FIG. 7 is a schematic cross-sectional view of still another modified semiconductor device according to an example embodiment.
Figure 8:
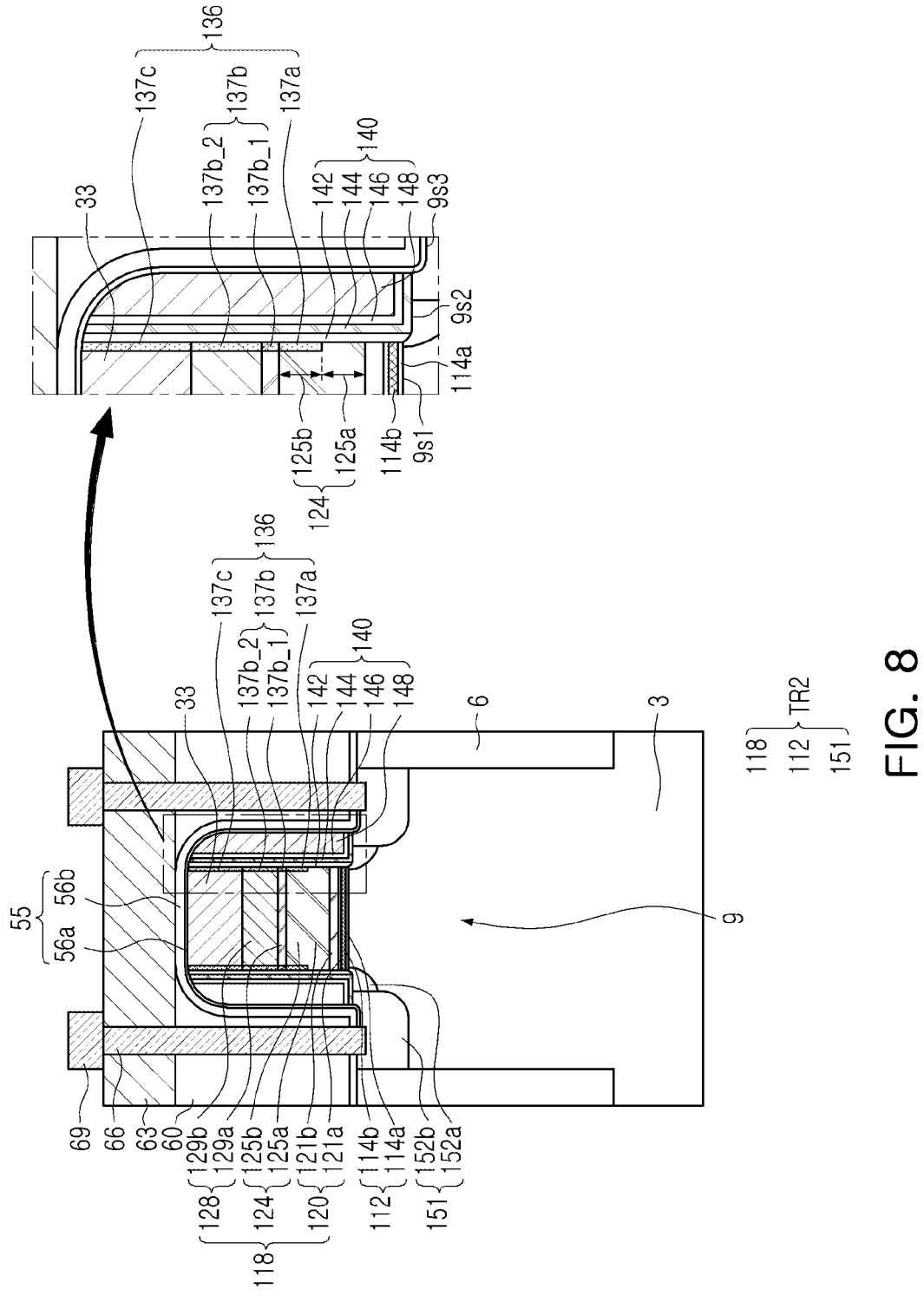
FIG. 8 is a schematic cross-sectional view of yet another modified semiconductor device according to an example embodiment.

Next, various modified examples of the elements of the semiconductor device 100 described above will be described with reference to FIGS. 7 and 8, respectively. In various modified examples of the elements of the semiconductor device 100 described above, modified elements or replaced elements will be mainly described below. In addition, elements that may be modified or replaced to be described below will be described with reference to the respective drawings, but elements that may be modified may be combined with each other to configure a semiconductor device according to an example embodiment. FIGS. 7 and 8 are schematic cross-sectional views of various modified examples of the elements of the semiconductor device 100 described above.

In a modified example, referring to FIG. 7, the intermediate conductive pattern 124 including the first intermediate portion 125a and the second intermediate portion 125b that have different widths as described with reference to FIG. 6 may be modified into an intermediate conductive pattern 124$c$ having substantially the same width. For example, the intermediate conductive pattern 124 (see FIG. 6) described with reference to FIG. 6 may have a side surface with a step, while the intermediate conductive pattern 124$c$ as illustrated in FIG. 7 may have a substantially vertical side surface without a step. The first protective portion 137$a$ (see FIG. 6) of the protective layer 136 described with reference to FIG. 6 may be modified into a first protective portion 137$a$3 in contact with an entire side surface of the intermediate conductive pattern 124$c$.

In a modified example, referring to FIG. 8, an upper surface of the active region 9 in FIGS. 6 and 7 may be substantially flat, but example embodiments are not limited thereto. For example, the flat upper surface of the active region 9 in FIGS. 6 and 7 may be modified into an upper surface including a first surface 9$s$1 positioned below the gate electrode 118, a second surface 9$s$2 positioned on a level lower than the first surface 9$s$1 below the spacer structure 140, and a third surface 9$s$3 positioned below the insulating liner 55 and the interlayer insulating layer 60 outside the spacer structure 140 and positioned on a level lower than the second surface 9$s$2. The contact structures 66 may penetrate through the third surface 9$s$3 and extend into the high-concentration impurity regions 152$b$ of the source/drain regions 151. In an example embodiment, a boundary between the first surface 9$s$1 and the second surface 9$s$2 may be aligned with the side surface of the gate electrode 118 or may vertically overlap the gate electrode 118.

Figure 9:
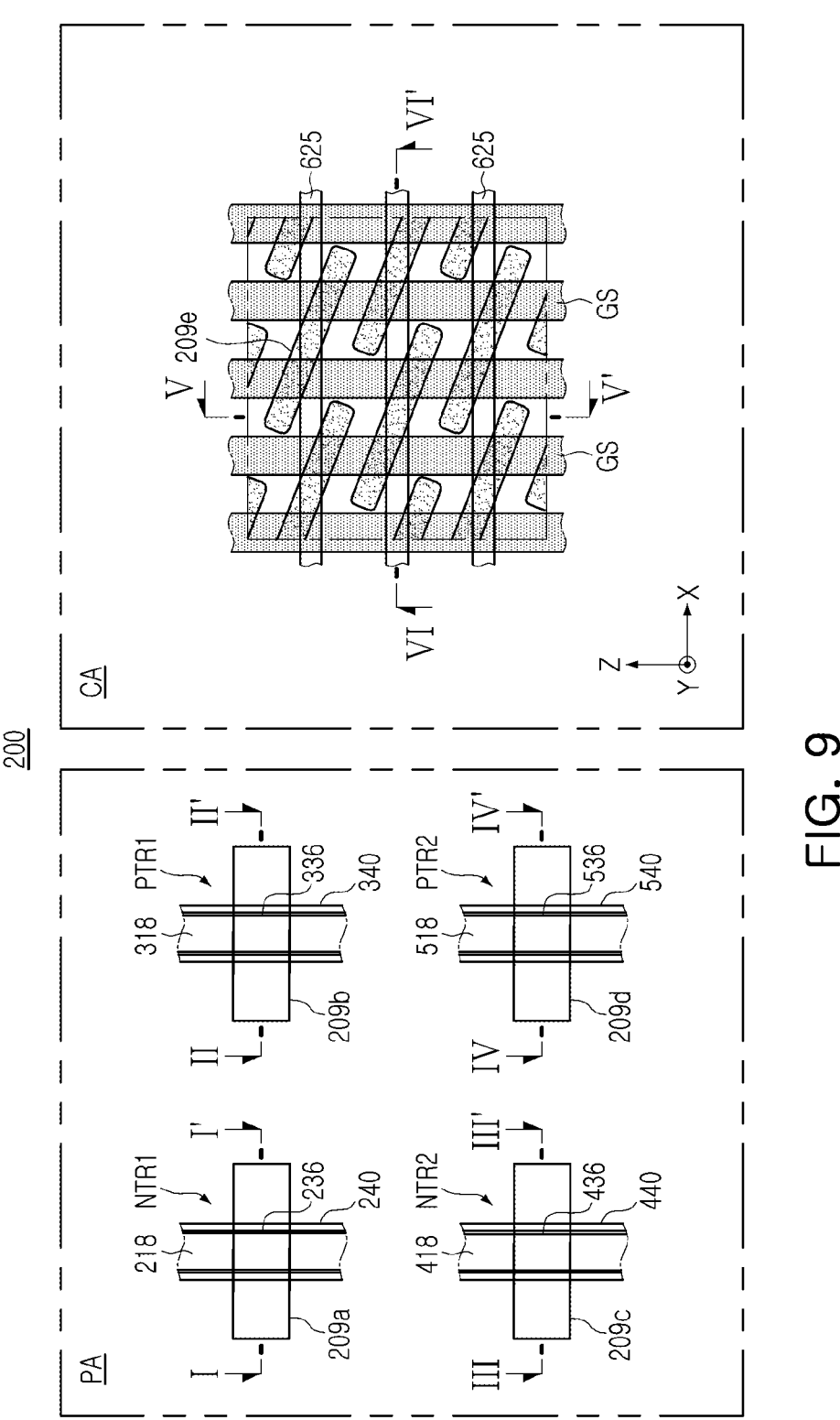
FIGS. 9 to 10C are schematic views of still another modified semiconductor device according to an example embodiment.
Figure 10A:
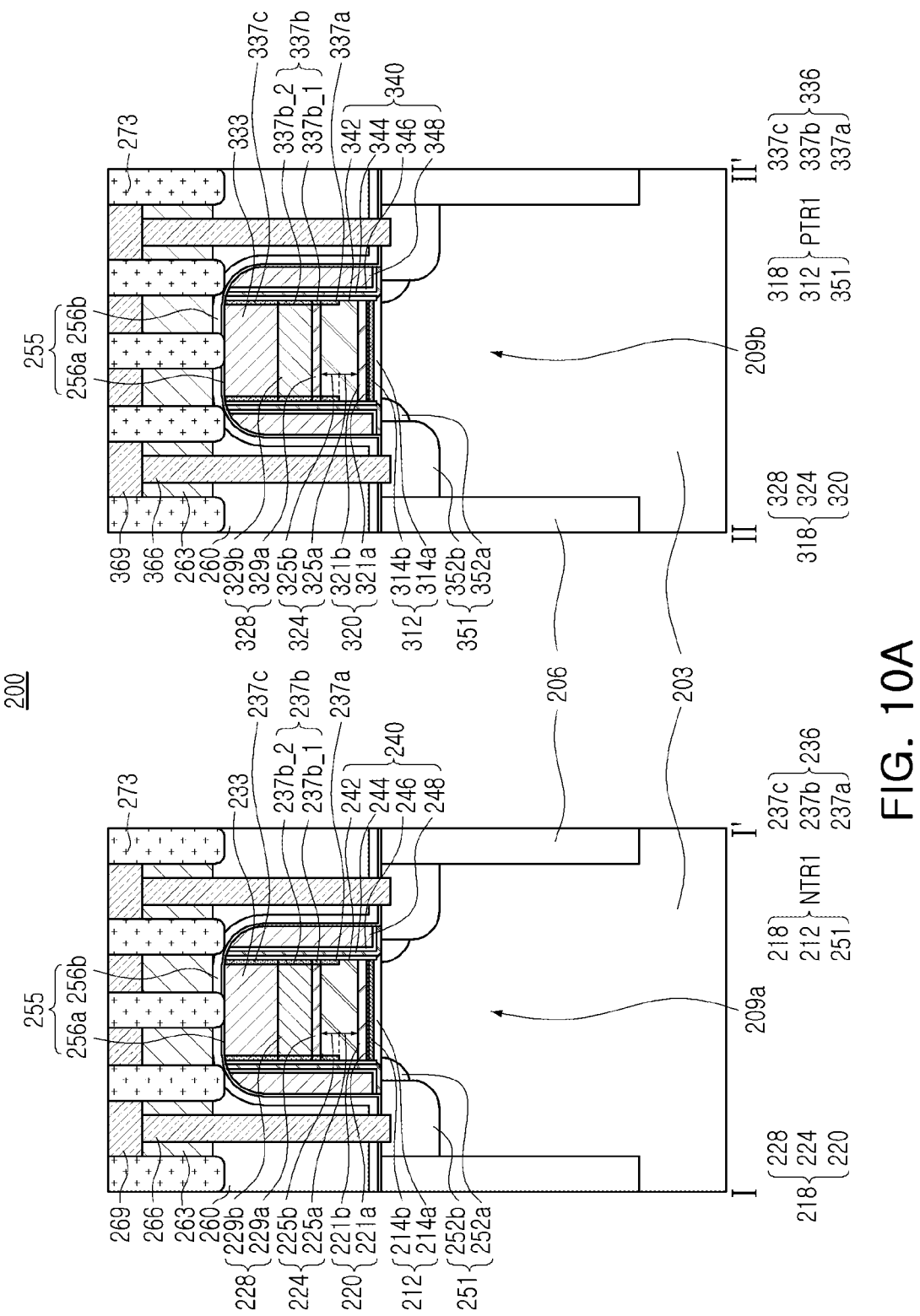
Figure 10B:
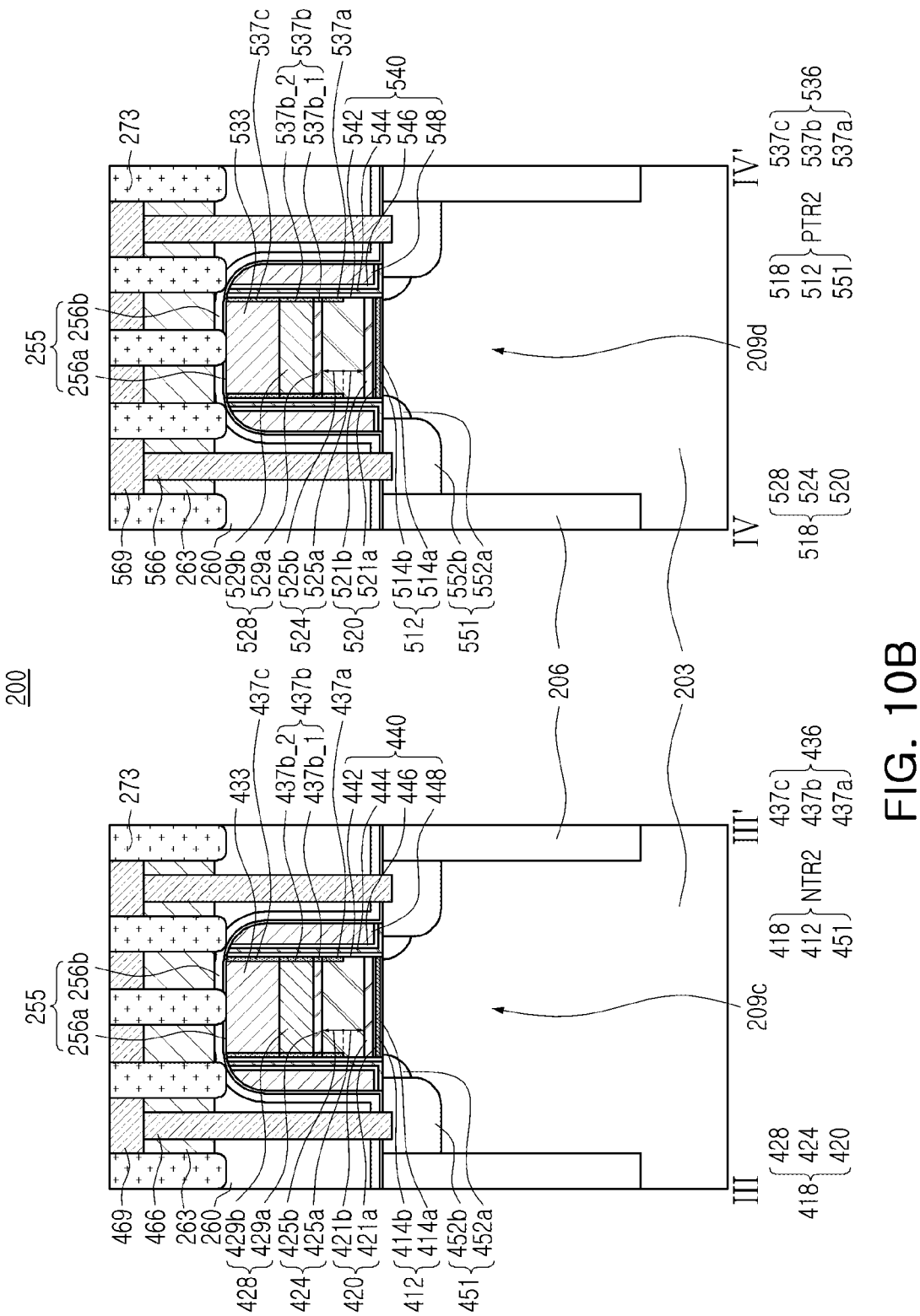
Figure 10C:
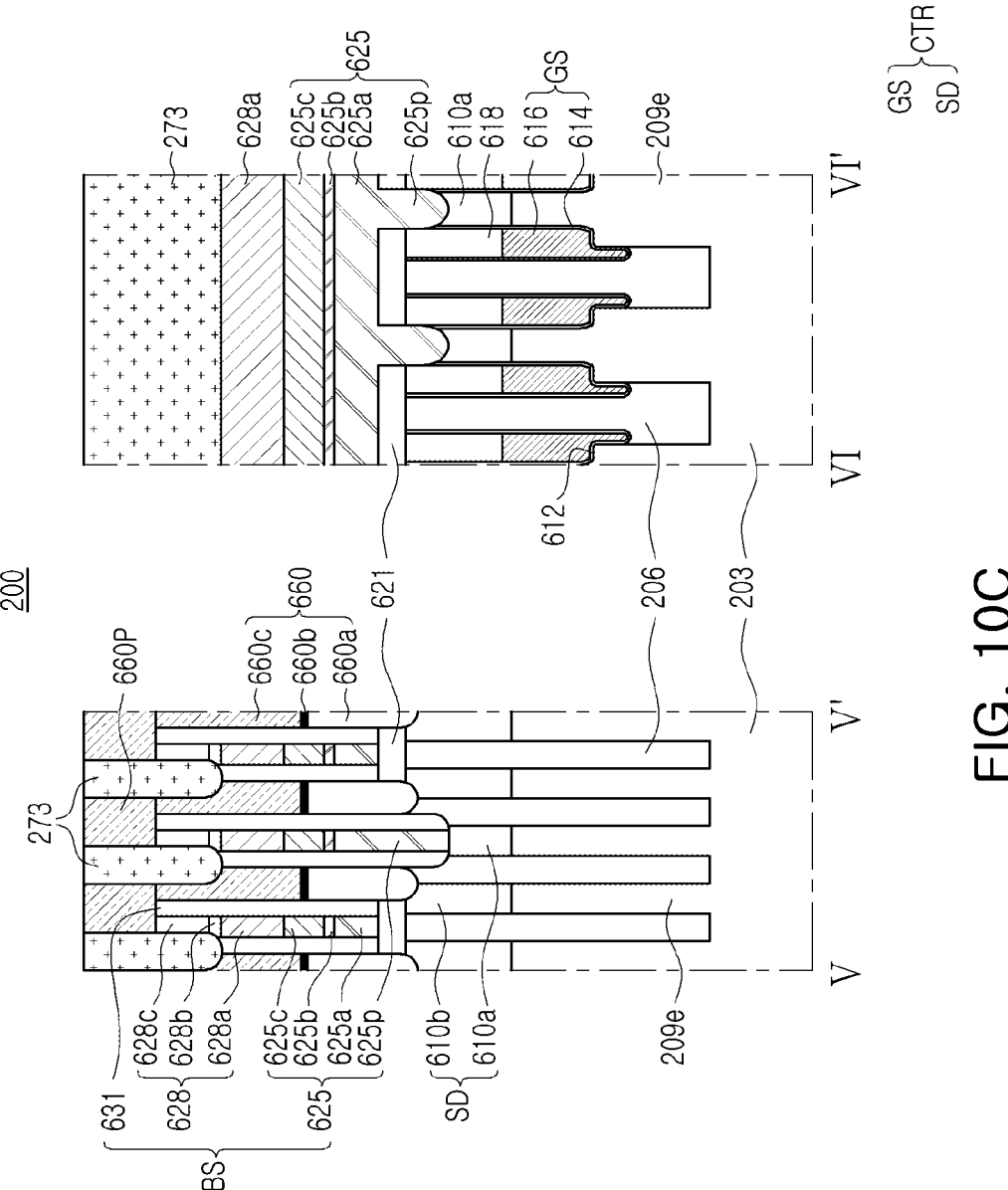

Next, a modified example of a semiconductor device according to an example embodiment will be described with reference to FIGS. 9 to 10C. FIG. 9 is a schematic plan view illustrating a modified example of a semiconductor device according to an example embodiment, FIG. 10A is a cross-sectional view illustrating regions taken along line I-I' and line II-IF of FIG. 9, FIG. 10B is a cross-sectional view illustrating regions taken along line and line IV-IV' of FIG. 9, and FIG. 10C is a cross-sectional view illustrating regions taken along line V-V' and line VI-VI' of FIG. 9.

In a modified example, referring to FIGS. 9, 10A, 10B and 10C, a semiconductor device 200 according to an example embodiment may include a substrate 203 having a memory cell area CA and a peripheral circuit area PA, and an isolation layer 206 defining a cell active region 209$e$ on the memory cell area CA of the substrate 203 and defining a plurality of peripheral active regions 209$a$, 209$b$, 209$c$, and 209$d$ on the peripheral circuit area PA of the substrate 203. The substrate 203 may be a semiconductor substrate. The cell active region 209$e$ and the peripheral active regions 209$a$, 209$b$, 209$c$, and 209$d$ may protrude from the substrate 203 in a vertical direction Z. The isolation layer 206 may be formed by shallow trench isolation. The isolation layer 206 may be formed of an insulating material, e.g., a silicon oxide and/or a silicon nitride.

The semiconductor device 200 according to an example embodiment may include cell gate structures GS embedded in the cell active region 209$e$ on the memory cell area CA and extending into the isolation layer 206 and cell gate capping patterns 618 disposed on the cell gate structure GS. The cell gate structures GS and the cell gate capping patterns 618 may be disposed in cell gate trenches 612 extending into the isolation layer 206 while traversing the cell active region 209$e$.

Each of the cell gate structures GS may include a cell gate dielectric layer 614 conformally covering an inner wall of the cell gate trench 612 and a cell gate electrode 616 partially filling the cell gate trench 612 on the cell gate dielectric layer 614. The cell gate electrode 616 may be a word line of a memory semiconductor device, e.g., a dynamic random access memory (DRAM).

The cell gate electrode 616 may include, e.g., doped polysilicon, a metal, a conductive metal nitride, a metal-semiconductor compound, a conductive metal oxide, graphene, a carbon nanotube, or a combination thereof. For example, the cell gate electrode 616 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotubes, or a combination thereof. The cell gate electrode 616 may include a single layer or multiple layers formed of the above-described materials. For example, the cell gate electrode 616 may include a first electrode layer that may be formed of a metal material and a second electrode layer that may be formed of doped polysilicon on the first electrode layer. The cell gate capping pattern 618 may include an insulating material, e.g., a silicon nitride.

The semiconductor device 200 according to an example embodiment may further include cell sources/drains SD including a first impurity region 610$a$ and a second impurity region 610$b$ disposed in the cell active region 209$e$ on the memory cell area CA. The cell gate structures GS and the cell sources/drains SD may constitute cell transistors CTR.

The semiconductor device 200 according to an example embodiment may further include, on the memory cell area CA, a buffer insulating layer 621 disposed on the cell active region 209$e$ and the isolation layer 206, wiring structures BS disposed on the buffer insulating layer 621 and including a bit line plug portion 625$p$ penetrating through the buffer insulating layer 621, cell contact structures 660 disposed on both sides of the wiring structure BS, pad portions 660P overlapping portions of the wiring structures BS and electrically connected to the cell contact structures 660, and insulating isolation structures 273 disposed between the pad portions 660P and extending downward. Each of the wiring structures BS may include a conductive line 625 and a wiring capping layer 628 that are sequentially stacked, and insulating spacers 631 disposed on sides of the conductive line 625 and the wiring capping layer 628.

In each of the wiring structures BS, the conductive line 625 may include a first layer 625$a$, a second layer 625$b$, and a third layer 625$c$ that are sequentially stacked, and the bit line plug portion 625$p$ may extend downward from a portion of the first layer 625$a$ and be electrically connected to the first impurity region 610$a$ of the first sources/drains SD. In the conductive line 625, the first layer 625$a$ may be formed as a doped silicon layer, the second layer 625$b$ may be formed as a metal nitride and/or a metal-semiconductor compound layer (e.g., WN, TiN, WSi, TiSi, and/or TiSiN, etc.), and the third layer 625$c$ may be formed as a metal layer (e.g., W, etc.).

In an example embodiment, the wiring structures BS may be bit line structures. For example, the conductive line 625 may be a bit line including the bit line plug portion 625$p$ electrically connected to the first impurity region 610$a$. The conductive line 625 may be a bit line of a memory device, e.g., a DRAM.

The wiring capping layer 628 may include a first layer 628$a$, a second layer 628$b$, and a third layer 628$c$ that are sequentially stacked. The wiring capping layer 628 may be formed of a silicon nitride and/or a silicon nitride-based insulating material.

The semiconductor device 200 according to an example embodiment may further include a plurality of peripheral transistors NTR1, PTR1, NTR2, and PTR2 disposed on the peripheral circuit area PA. The plurality of peripheral transistors NTR1, PTR1, NTR2, and PTR2 may include a first NMOS transistor NTR1, a first PMOS transistor PTR1, a second NMOS transistor NTR2, and a second PMOS transistor PTR2. In an example embodiment, the first NMOS transistor NTR1 and the first PMOS transistor PTR1 may be high voltage devices, and the second NMOS transistor NTR2 and the second PMOS transistor PTR2 may be low voltage devices.

The first NMOS transistor NTR1 may have substantially the same structure as the transistor TR1 when the transistor TR1 is the NMOS transistor as described with reference to FIG. 1. For example, the first NMOS transistor NTR1 may include a first NMOS gate dielectric pattern 212 disposed on the first peripheral active region 209a, a first NMOS gate electrode 218 disposed on the first NMOS gate dielectric pattern 212, and first NMOS peripheral source/drain regions 251 disposed in the first peripheral active region 209a adjacent to both sides of the first NMOS gate electrode 218 and including a low-concentration impurity region 252a and a high-concentration impurity region 252b.

The first NMOS gate dielectric pattern 212 may include a first NMOS lower dielectric layer 214a and a first NMOS upper dielectric layer 214b that may respectively correspond to the first lower dielectric layer 14a and the first upper dielectric layer 14b described with reference to FIG. 1. The first NMOS lower conductive pattern 220 may include a first NMOS lower conductive layer 221a and a second NMOS lower conductive layer 221b that may respectively correspond to the first lower conductive layer 21a and the second lower conductive layer 21b described with reference to FIG. 1. The first NMOS intermediate conductive pattern 224 may include a first NMOS intermediate portion 225a and a second NMOS intermediate portion 225b that may respectively correspond to the first intermediate portion 25a and the second intermediate portion 25b described with reference to FIG. 1. The first NMOS upper conductive pattern 228 may include a first NMOS upper conductive layer 229a and a second NMOS upper conductive layer 229b that may respectively correspond to the first upper conductive layer 29a and the second upper conductive layer 29b described with reference to FIG. 1.

In an example embodiment, the first layer 625a of the conductive line 625 and the first NMOS intermediate conductive pattern 224 may include polysilicon having the same N-type conductivity. The second layer 625b of the conductive line 625 and the first NMOS upper conductive layer 229a may include the same second conductive material. The third layer 625c of the conductive line 625 and the second NMOS upper conductive layer 229b may include the same third conductive material. Resistivity of the third conductive material may be lower than that of the first and second conductive materials.

The first PMOS transistor PTR1 may have substantially the same structure as the transistor TR1 when the transistor TR1 is the PMOS transistor as described with reference to FIG. 1. For example, the first PMOS transistor PTR1 may include a first PMOS gate dielectric pattern 312 disposed on the second peripheral active region 209b, a first PMOS gate electrode 318 disposed on the first PMOS gate dielectric pattern 312, and first PMOS peripheral source/drain regions 351 disposed in the second peripheral active region 209b adjacent to both sides of the first PMOS gate electrode 318 and including a low-concentration impurity region 352a and a high-concentration impurity region 352b.

The first PMOS gate dielectric pattern 312 may include a first PMOS lower dielectric layer 314a and a first PMOS upper dielectric layer 314b that may respectively correspond to the first lower dielectric layer 14a and the first upper dielectric layer 14b described with reference to FIG. 1. The first PMOS lower conductive pattern 320 may include a first PMOS lower conductive layer 321a and a second PMOS lower conductive layer 321b that may respectively correspond to the first lower conductive layer 21a and the second lower conductive layer 21b described with reference to FIG. 1. The first PMOS intermediate conductive pattern 324 may include a first PMOS intermediate portion 325a and a second PMOS intermediate portion 325b that may respectively correspond to the first intermediate portion 25a and the second intermediate portion 25b described with reference to FIG. 1. The first PMOS upper conductive pattern 328 may include a first PMOS upper conductive layer 329a and a second PMOS upper conductive layer 329b that may respectively correspond to the first upper conductive layer 29a and the second upper conductive layer 29b described with reference to FIG. 1.

The second NMOS transistor NTR2 may have substantially the same structure as the transistor TR2 when the transistor TR2 is the NMOS transistor as described with reference to FIG. 6. For example, the second NMOS transistor NTR2 may include a second NMOS gate dielectric pattern 412 disposed on the third peripheral active region 209c, a second NMOS gate electrode 418 disposed on the second NMOS gate dielectric pattern 412, and second NMOS peripheral source/drain regions 451 disposed in the third peripheral active region 209c adjacent to both sides of the second MMOS gate electrode 418 and including a low-concentration impurity region 452a and a high-concentration impurity region 452b.

The second NMOS gate dielectric pattern 412 may include a second NMOS lower dielectric layer 414a and a second NMOS upper dielectric layer 414b that may respectively correspond to the first lower dielectric layer 114a and the first upper dielectric layer 114b described with reference to FIG. 6. The second NMOS lower conductive pattern 420 may include a first NMOS lower conductive layer 421a and a second NMOS lower conductive layer 421b that may respectively correspond to the first lower conductive layer 121a and the second lower conductive layer 121b described with reference to FIG. 6. The second NMOS intermediate conductive pattern 424 may include a first NMOS intermediate portion 425a and a second NMOS intermediate portion 425b that may respectively correspond to the first intermediate portion 125a and the second intermediate portion 125b described with reference to FIG. 6. The second NMOS upper conductive pattern 428 may include a first NMOS upper conductive layer 429a and a second NMOS upper conductive layer 429b that may respectively correspond to the first upper conductive layer 129a and the second upper conductive layer 129b described with reference to FIG. 6.

The second PMOS transistor PTR2 may have substantially the same structure as the transistor TR2 when the transistor TR2 is the PMOS transistor as described with reference to FIG. 6. For example, the second PMOS transistor PTR2 may include a second PMOS gate dielectric pattern 512 disposed on the fourth peripheral active region 209d, a second PMOS gate electrode 518 disposed on the second PMOS gate dielectric pattern 512, and second PMOS peripheral source/drain regions 551 disposed in the fourth peripheral active region 209d adjacent to both sides of the second PMOS gate electrode 518 and including a low-concentration impurity region 552a and a high-concentration impurity region 552b.

The second PMOS gate dielectric pattern 512 may include a second PMOS lower dielectric layer 514a and a second PMOS upper dielectric layer 514b that may respectively correspond to the first lower dielectric layer 114a and the first upper dielectric layer 114b described with reference to FIG. 6. The second PMOS lower conductive pattern 520 may include a first PMOS lower conductive layer 521a and a second PMOS lower conductive layer 521b that may respectively correspond to the first lower conductive layer 121a and the second lower conductive layer 121b described with reference to FIG. 6. The second PMOS intermediate conductive pattern 524 may include a first PMOS intermediate portion 525a and a second PMOS intermediate portion 525b that may respectively correspond to the first intermediate portion 125a and the second intermediate portion 125b described with reference to FIG. 6. The second PMOS upper conductive pattern 528 may include a first PMOS upper conductive layer 529a and a second PMOS upper conductive layer 529b that may respectively correspond to the first upper conductive layer 129a and the second upper conductive layer 129b described with reference to FIG. 6.

Figure 2:
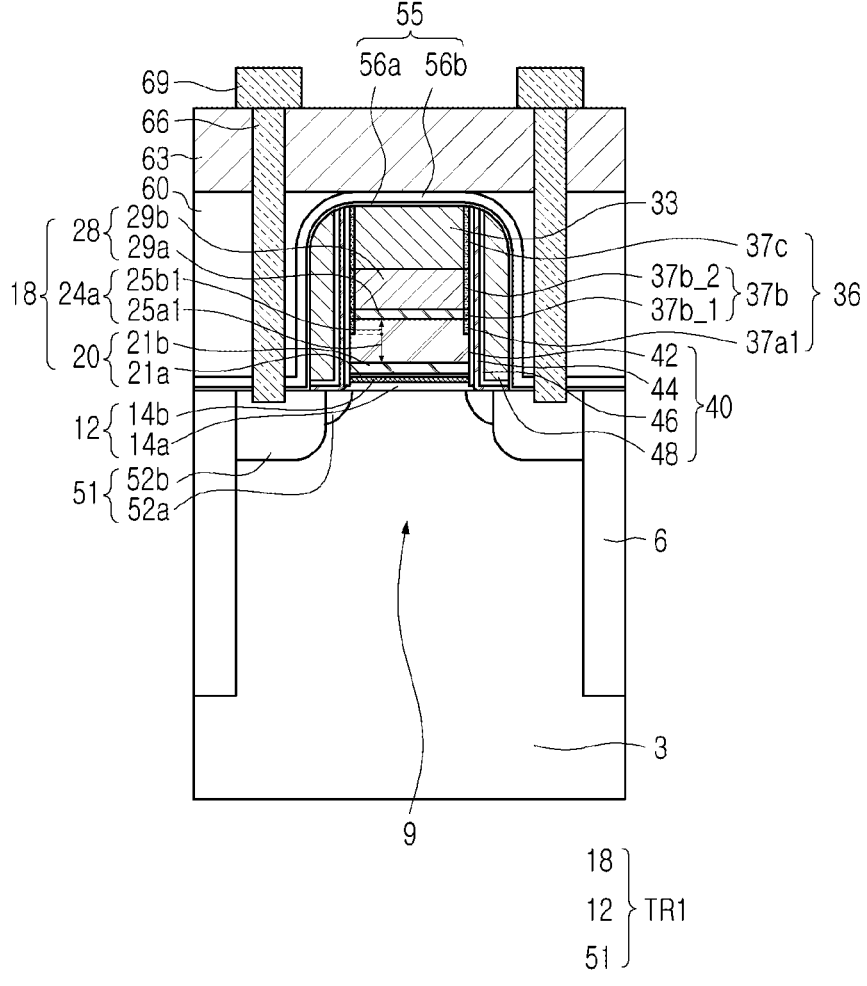
FIG. 2 is a schematic cross-sectional view of a modified semiconductor device according to an example embodiment.
Figure 3:
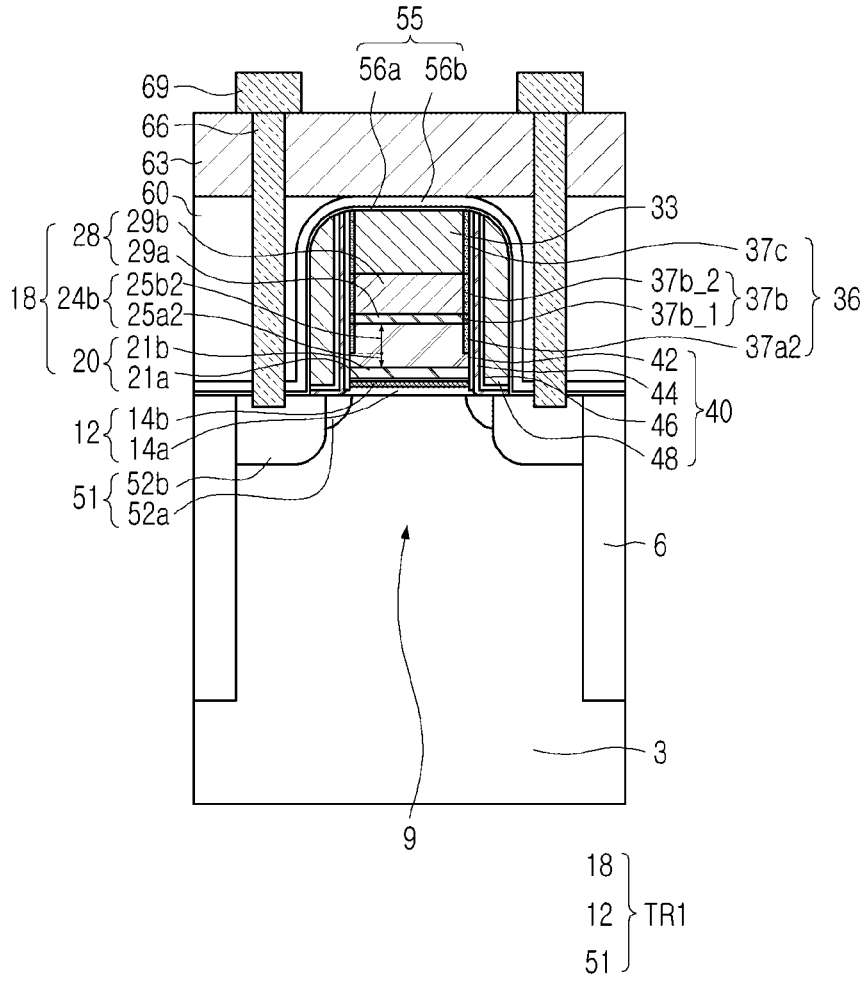
FIG. 3 is a schematic cross-sectional view of another modified semiconductor device according to an example embodiment.

The first NMOS intermediate conductive pattern 224, the first PMOS intermediate conductive pattern 324, the second NMOS intermediate conductive pattern 424, and the second PMOS intermediate conductive pattern 524 may be modified to have substantially the same structure as the intermediate conductive pattern 24a (see FIG. 2) or 24b (see FIG. 3) as illustrated in FIG. 2 or FIG. 3.

The semiconductor device 200 according to an example embodiment may further include a first NMOS gate capping pattern 233 disposed on the first NMOS gate electrode 218, a first PMOS gate capping pattern 333 disposed on the first PMOS gate electrode 318, a second NMOS gate capping pattern 433 disposed on the second NMOS gate electrode 418, and a first PMOS gate capping pattern 533 disposed on the second PMOS gate electrode 518. Each of the first NMOS gate capping pattern 233, the first PMOS gate capping pattern 333, the second NMOS gate capping pattern 433, and the first PMOS gate capping pattern 533 may include a silicon nitride.

The semiconductor device 200 according to an example embodiment may further include a first NMOS gate protective layer 236 in contact with a portion of a side surface of the first NMOS gate electrode 218 and a side surface of the first NMOS gate capping pattern 233, and a first NMOS spacer structure 240 covering the side surface of the first NMOS gate electrode 218 and the side surface of the first NMOS gate capping pattern 233 and covering the first NMOS gate protective layer 236.

The semiconductor device 200 according to an example embodiment may further include a first PMOS gate protective layer 336 in contact with a portion of a side surface of the first PMOS gate electrode 318 and a side surface of the first PMOS gate capping pattern 333, and a first PMOS spacer structure 340 covering the side surface of the first PMOS gate electrode 318 and the side surface of the first PMOS gate capping pattern 333 and covering the first PMOS gate protective layer 336.

The semiconductor device 200 according to an example embodiment may further include a second NMOS gate protective layer 436 in contact with a portion of a side surface of the second NMOS gate electrode 418 and a side surface of the second NMOS gate capping pattern 433, and a second NMOS spacer structure 440 covering the side surface of the second NMOS gate electrode 418 and the side surface of the second NMOS gate capping pattern 433 and covering the second NMOS gate protective layer 436.

The semiconductor device 200 according to an example embodiment may further include a second PMOS gate protective layer 536 in contact with a portion of a side surface of the second PMOS gate electrode 518 and a side surface of the second PMOS gate capping pattern 533, and a second PMOS spacer structure 540 covering the side surface of the second PMOS gate electrode 518 and the side surface of the second PMOS gate capping pattern 533 and covering the second PMOS gate protective layer 536.

In an example embodiment, each of the first and second NMOS gate protective layers 236 and 436 and the first and second PMOS gate protective layers 336 and 536 may be substantially the same as the protective layer 36 described with reference to FIG. 1. For example, the first and second NMOS gate protective layers 236 and 436, and the first and second PMOS gate protective layers 336 and 536 may include, respectively, first protective portions 237a, 437a, 337a, and 537a, second protective portions 237b, 437b, 337b, and 537b, and third protective portions 237c, 437c, 337c, and 537c that may respectively correspond to the first protective portion 37a, the second protective portion 37b, and the third protective portion 37c described with reference to FIG. 1. The second protective portions 237b, 337b, 437b, and 437b may include, respectively, first portions 237b_1, 337b_1, 437b_1, and 537b_1 and second portions 237b_2, 337b_2, 437b_2, and 537b_2 that may respectively correspond to the first portion 37b_1 and the second portion 37b_2 described with reference to FIG. 1.

In an example embodiment, the first protective portion 237a, 337a, 437a, 537a may be modified like the second protective portion 37a1 (see FIG. 2) or 37a2 (see FIG. 3) described with reference to FIG. 2 or FIG. 3.

In an example embodiment, the first NMOS spacer structure 240 and the first PMOS spacer structure 340 may be substantially the same as the spacer structure 40 described with reference to FIG. 1. For example, the first NMOS spacer structure 240 and the first PMOS spacer structure 340 may include, respectively, first spacer layers 242 and 342, second spacer layers 244 and 344, third spacer layers 246 and 346, and fourth spacer layers 248 and 348 respectively corresponding to the first spacer layer 42, the second spacer layer 44, the third spacer layer 46, and the fourth spacer layer 48 described with reference to FIG. 1.

In an example embodiment, the second NMOS spacer structure 440 and the second PMOS spacer structure 540 may be substantially the same as the spacer structure 140 described with reference to FIG. 6. For example, the second NMOS spacer structure 440 and the second PMOS spacer structure 540 may include, respectively, first spacer layers 442 and 542, second spacer layers 444 and 544, third spacer layers 446 and 546, and fourth spacer layers 448 and 548 respectively corresponding to the first spacer layer 142, the second spacer layer 144, the third spacer layer 146, and the fourth spacer layer 148 described with reference to FIG. 6.

The semiconductor device 200 according to an example embodiment may further include an insulating liner 255 covering the first and second NMOS transistors NTR1 and NTR2, the first and second PMOS transistors PTR1 and PTR2, the gate capping patterns 233, 333, 433, and 533, and the spacer structures 240, 340, 440, and 540 on the peripheral circuit area PA, an interlayer insulating layer 260 disposed on the insulating liner 255, and an upper capping insulating layer 263 disposed on the interlayer insulating layer 260 and the insulating liner 255. The insulating liner 255 may include a buffer oxide layer 256a and a liner layer 256b that may respectively correspond to the buffer oxide layer 56a and the liner layer 56b described with reference to FIG. 1. The interlayer insulating layer 260 and the upper capping insulating layer 263 may respectively correspond to the interlayer insulating layer 260 and the upper capping insulating layer 263 described with reference to FIG. 1.

The semiconductor device 200 according to an example embodiment may further include first NMOS contact structures 266, first PMOS contact structures 366, second NMOS contact structures 466, and second PMOS contact structures 566 sequentially penetrating through the upper capping insulating layer 263, the interlayer insulating layer 260, and the insulating liner 255. The first NMOS contact structures 266 may be electrically connected to the first NMOS source/drain regions 251, the first PMOS contact structures 366 may be electrically connected to the first PMOS source/drain regions 351, the second NMOS contact structures 466 may be electrically connected to the second NMOS source/drain regions 451, and the second PMOS contact structures 566 may be electrically connected to the second PMOS source/drain regions 551.

The semiconductor device 200 according to an example embodiment may further include first NMOS wiring patterns 269 disposed on the first NMOS contact structures 266, first PMOS wiring patterns 369 disposed on the first PMOS contact structures 366, second NMOS wiring patterns 469 disposed on the second NMOS contact structures 466, and second PMOS wiring patterns 569 disposed on the second PMOS contact structures 566.

The semiconductor device 200 according to an example embodiment may include insulating isolation structures 273 filling spaces between the first NMOS wiring patterns 269, the first PMOS wiring patterns 369, the second NMOS wiring patterns 469, and the second PMOS wiring patterns 569 and extending downward.

Figure 11A:
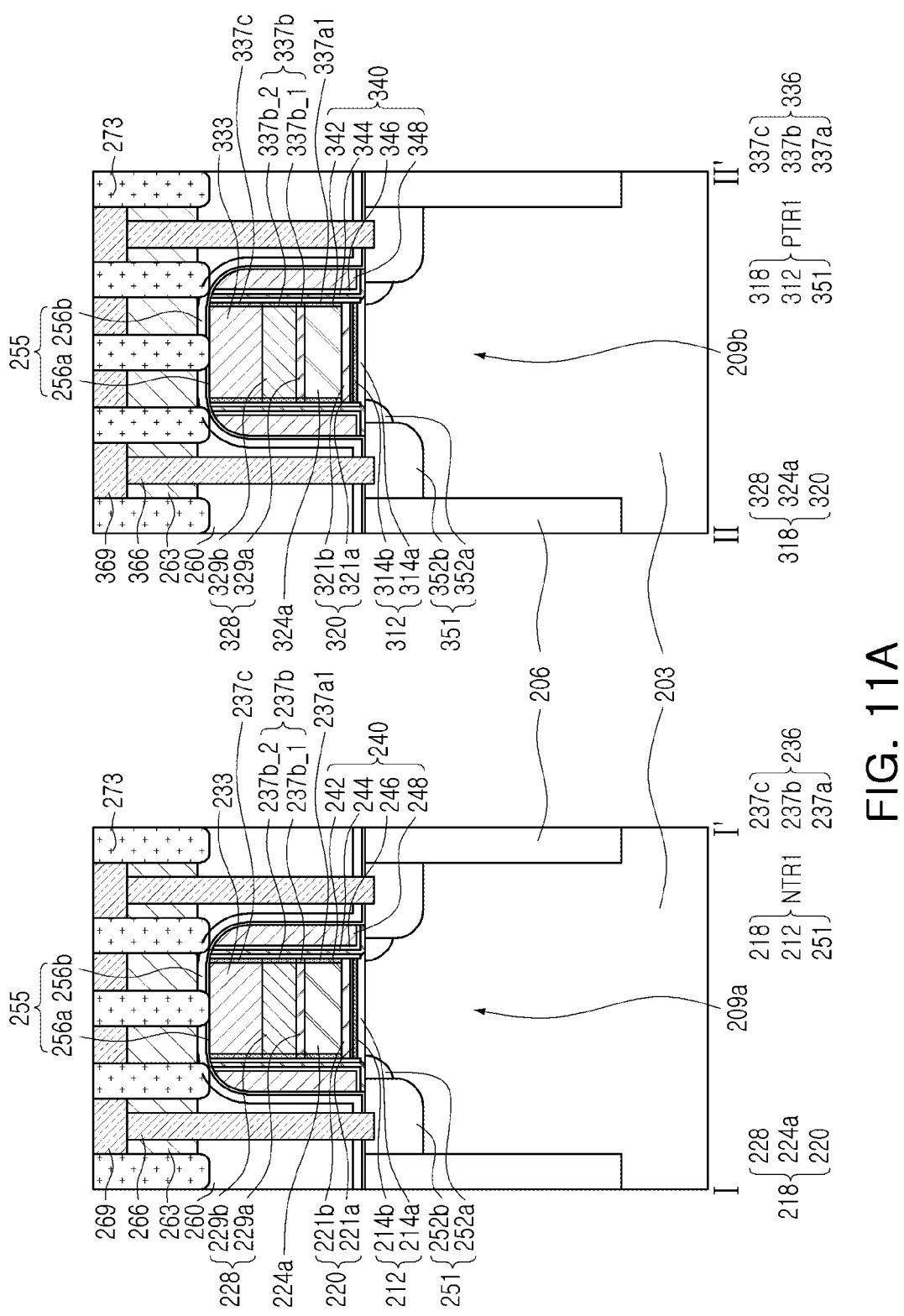
FIGS. 11A and 11B are schematic cross-sectional views of yet another modified semiconductor device according to an example embodiment.
Figure 11B:
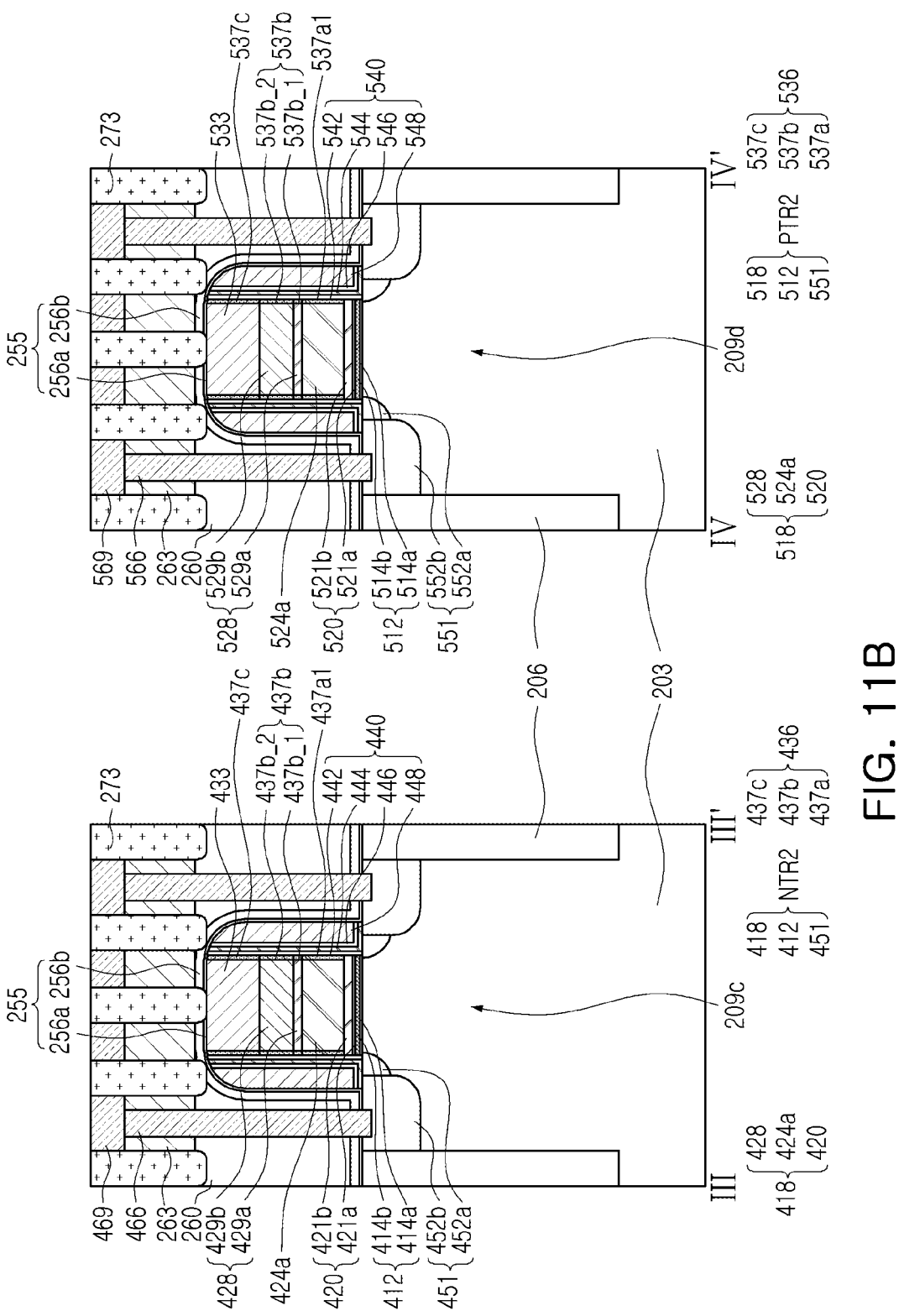
Figure 12A:
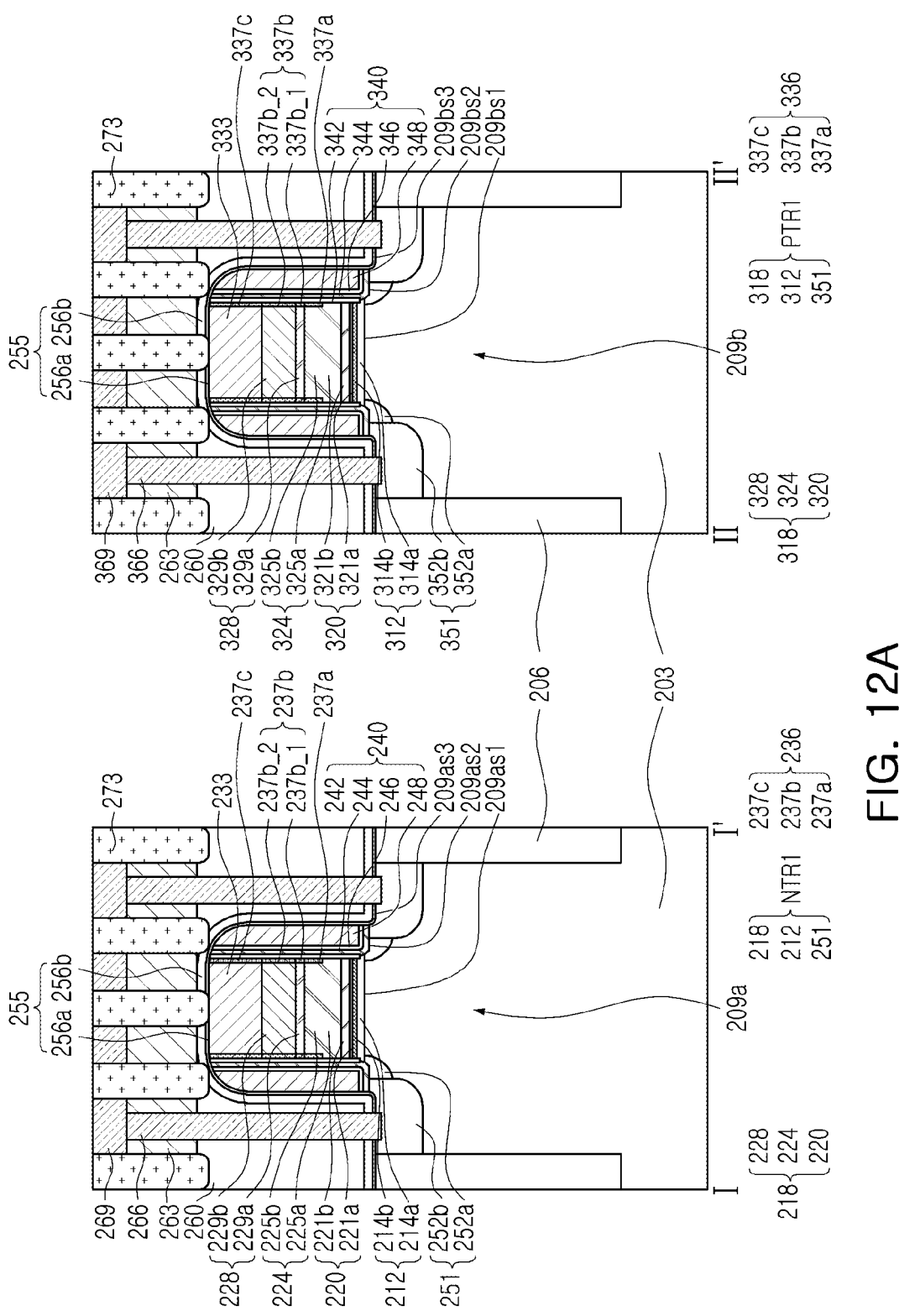
FIGS. 12A and 12B are schematic cross-sectional views of still another modified semiconductor device according to an example embodiment.
Figure 12B:
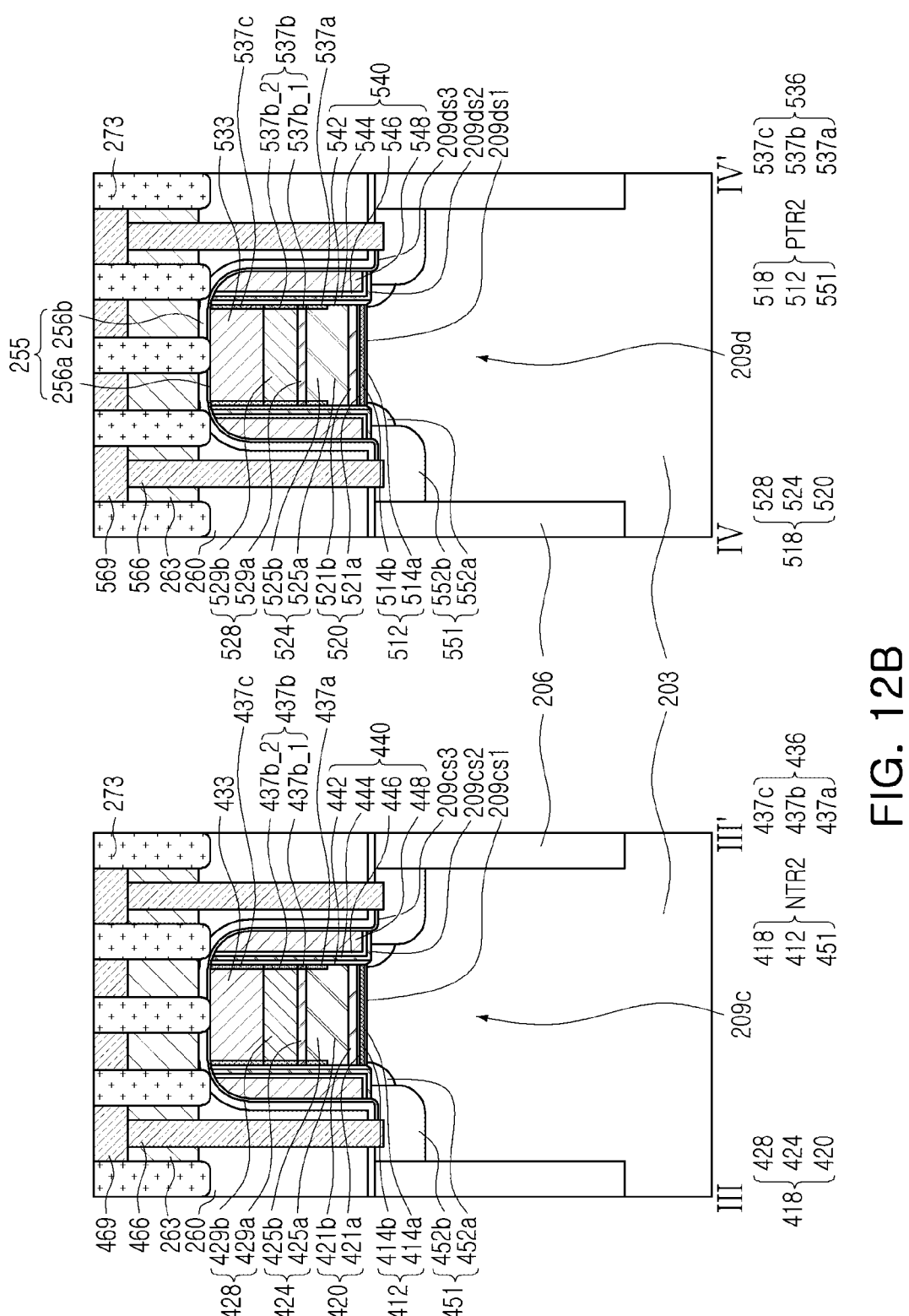

Next, various modified examples of the elements of the semiconductor device 200 described above will be described with reference to FIGS. 11A and 11B and with reference to FIGS. 12A and 12B. FIGS. 11A to 12B are schematic cross-sectional views for describing various modified examples of the elements of the semiconductor device 200 described above. FIGS. 11A and 12A are cross-sectional views illustrating regions taken along line I-I' and line II-IF of FIG. 9, respectively, and FIGS. 11B and 12B are cross-sectional views illustrating regions taken along line and IV-IV' of FIG. 9, respectively.

In a modified example, referring to FIGS. 11A and 11B, the first NMOS intermediate conductive pattern 224, the first PMOS intermediate conductive pattern 324, the second NMOS intermediate conductive pattern 424, and the second PMOS intermediate conductive pattern 524 described with reference to FIGS. 10A and 10B may be replaced, respectively, with a first NMOS intermediate conductive pattern 224a, a first PMOS intermediate conductive pattern 324a, a second NMOS intermediate conductive pattern 424a, and a second PMOS intermediate conductive pattern 524a that are substantially the same as the intermediate conductive pattern 24c as illustrated in FIG. 4.

In a modified example, referring to FIGS. 12A and 12B, upper surfaces of the first and second peripheral active regions 209a and 209b in FIGS. 10A and 11A may be modified to include, respectively, first surfaces 209as1 and 209bs1, second surfaces 209as2 and 209bs2, and third surfaces 209as3 and 209bs3 respectively corresponding to the first surface 9s1, the second surface 9s2, and the third surface 9s3 of the upper surface of the active region 9 as described with reference to FIG. 5.

Upper surfaces of the third and fourth peripheral active regions 209c and 209d in FIGS. 10B and 11B may be modified to include, respectively, first surfaces 209cs1 and 209ds1, second surfaces 209cs2 and 209ds2, and third surfaces 209cs3 and 209ds3 respectively corresponding to the first surface 9s1, the second surface 9s2, and the third surface 9s3 of the upper surface of the active region 9 as described with reference to FIG. 8.

Figure 13:
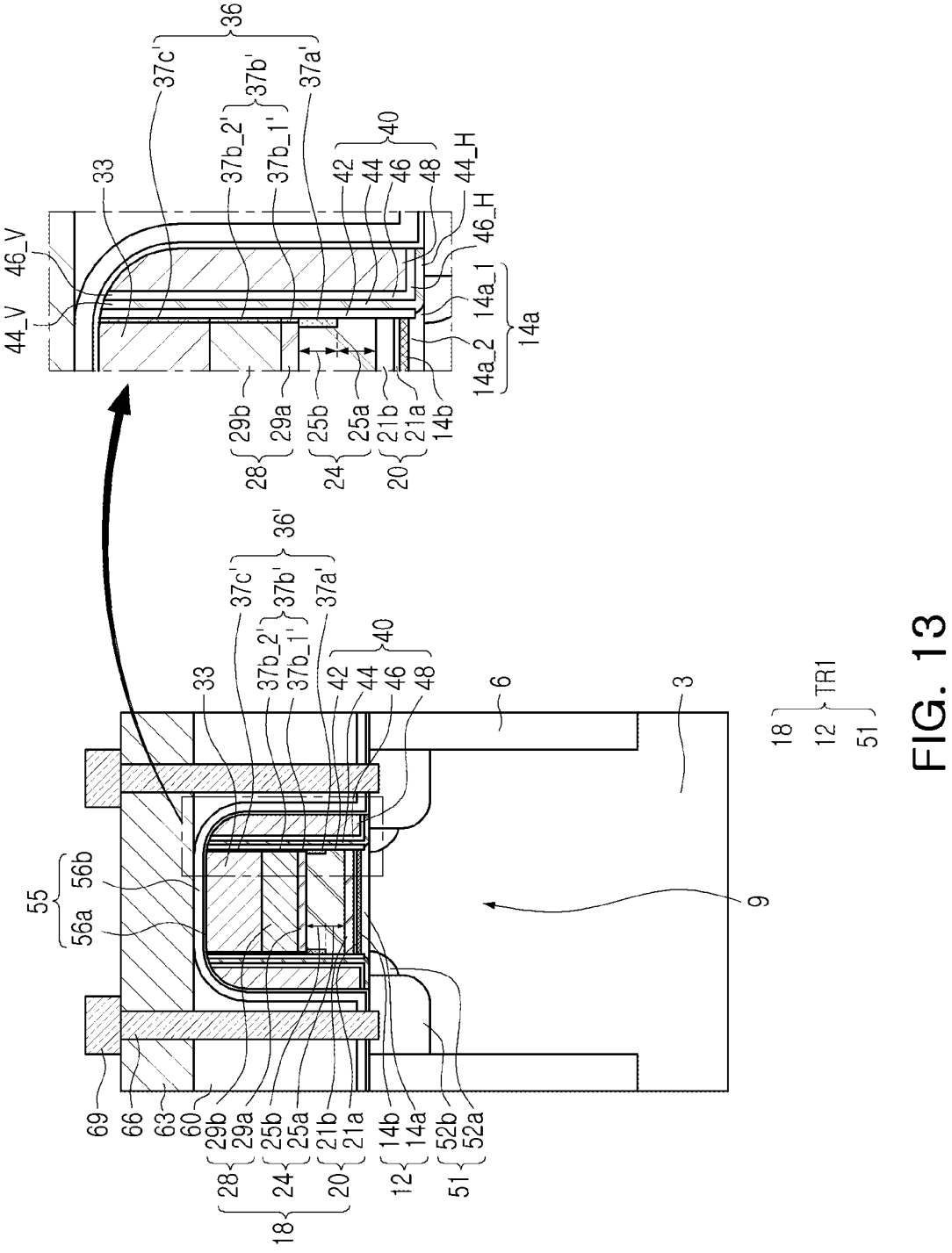
FIG. 13 is a schematic cross-sectional view of yet another a modified semiconductor device according to an example embodiment.

In the contents described above with reference to FIGS. 1 to 12B, an element using the term "protective layer" may be replaced with a protective layer including portions having different thicknesses, e.g., in the horizontal direction. An illustrative example of a protective layer including portions having different thicknesses will hereinafter be described with reference to FIG. 13. FIG. 13 is a cross-sectional view for describing a modified example of the protective layer 36 of FIG. 1.

In a modified example, referring to FIG. 13, a protective layer 36' that may replace the element using the term "protective layer" in the contents described above with reference to FIGS. 1 to 12B may include a first protective portion 37a' in contact with at least a portion of a side surface of the intermediate conductive pattern 24, a second protective portion 37b' in contact with a side surface of the upper conductive pattern 28, and a third protective portion 37c' in contact with a side surface of the gate capping pattern 33. The second protective portion 37b' may include a first portion 37b_1' in contact with a side surface of the first upper conductive layer 29a and a second portion 37b_2' in contact with a side surface of the second upper conductive layer 29b. The first protective portion 37a' may be formed of a silicon oxide, a silicon oxynitride, or a silicon nitride. The second protective portion 37b' may include a metal oxide, a metal oxynitride, or a metal nitride. The third protective portion 37c' may include a silicon nitride or a silicon oxynitride in which a concentration of N is increased.

The first protective portion 37a' may have a greater thickness than the second protective portion 37b' in the horizontal direction. The first protective portion 37a' may have a greater thickness than the third protective portion 37c' in the horizontal direction. The first protective portion 37a' may have a greater thickness than each of the second and third protective portions 37b' and 37c' in the horizontal direction.

Figure 14:
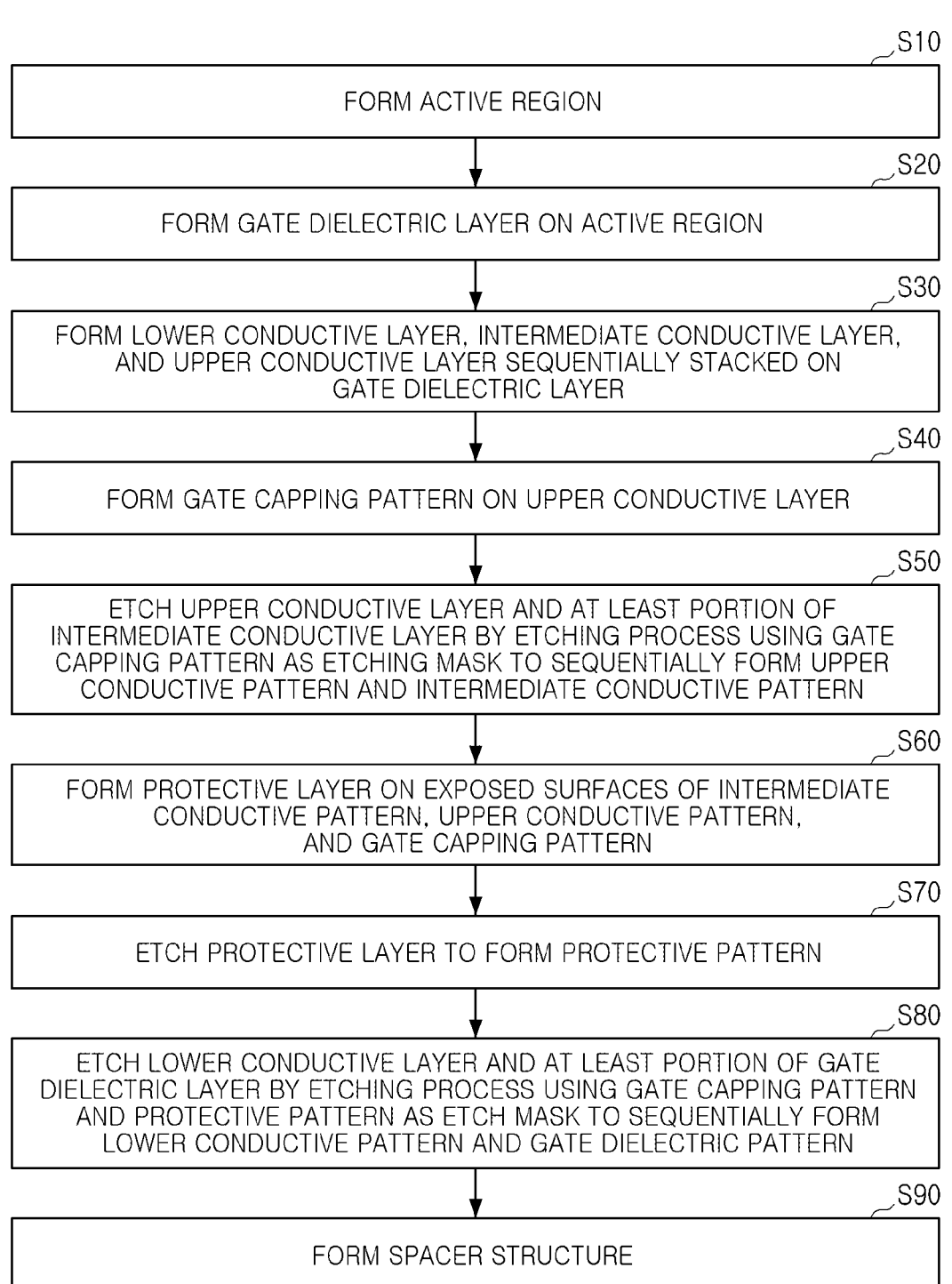
FIGS. 14 to 20 are schematic views of stages in a method of manufacturing a semiconductor device according to an example embodiment.

Next, an illustrative example of a method of manufacturing a semiconductor device according to an example embodiment will be described with reference to FIGS. 14 to 20. FIG. 14 is a process flow diagram of a method for manufacturing a semiconductor device according to an example embodiment, and FIGS. 15 to 20 are cross-sectional views of stages in the method for manufacturing a semiconductor device according to an example embodiment.

Figure 15:
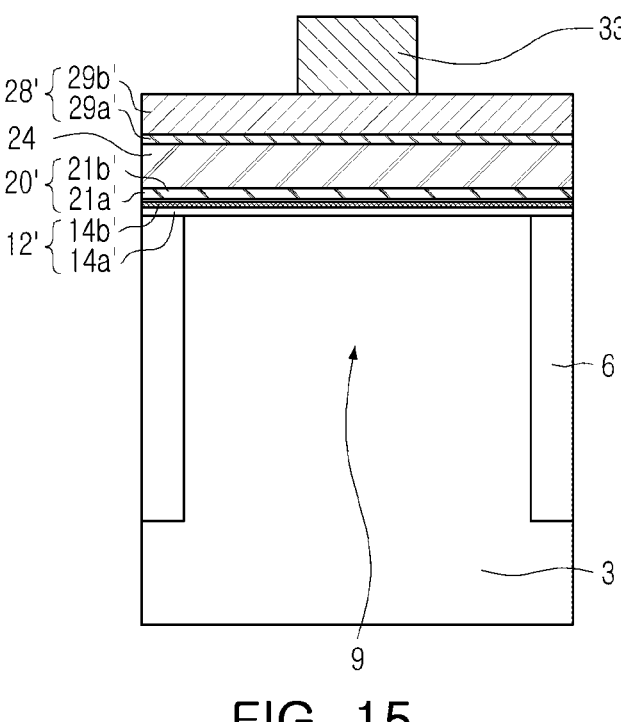

Referring to FIGS. 14 and 15, the active region 9 may be formed (S10). Forming of the active region 9 may include etching a portion of the substrate 3 to form a trench defining the active region 9 and forming the isolation layer 6 filling the trench.

A gate dielectric layer 12' may be formed on the active region 9 (S20). The gate dielectric layer 12' may be formed on the active region 9 and the isolation layer 6. The gate dielectric layer 12' may include a lower dielectric layer 14a' and an upper dielectric layer 14b' disposed on the lower dielectric layer 14a'. For example, the lower dielectric layer 14a' may be formed of a silicon oxide or a Si-based dielectric, and the upper dielectric layer 14b' may be formed of a high-κ dielectric.

A lower conductive layer 20', an intermediate conductive layer 24', and an upper conductive layer 28' sequentially stacked on the gate dielectric layer 12' may be formed (S30). The lower conductive layer 20' may include a first lower conductive layer 21a' and a second lower conductive layer 21*b*' that are sequentially stacked. The first lower conductive layer 21*a*' may be formed as a conductive layer including a rare earth metal element (e.g., La), and the second lower conductive layer 21*b*' may be formed as a conductive layer including at least one of, e.g., TiN, TiAl, TiAlC, TiAlN, TaN, TaAlC, and TaAlN.

The intermediate conductive layer 24' may be formed of, e.g., polysilicon having N-type conductivity.

The upper conductive layer 28' may include a first upper conductive layer 29*a*' and a second upper conductive layer 29*b*' that are sequentially stacked. The first upper conductive layer 29*a*' may be formed as, e.g., a titanium silicon nitride layer, and the second upper conductive layer 29*b*' may be formed as, e.g., a tungsten layer. The gate capping pattern 33 may be formed on the upper conductive layer 28' (S40).

Figure 16:
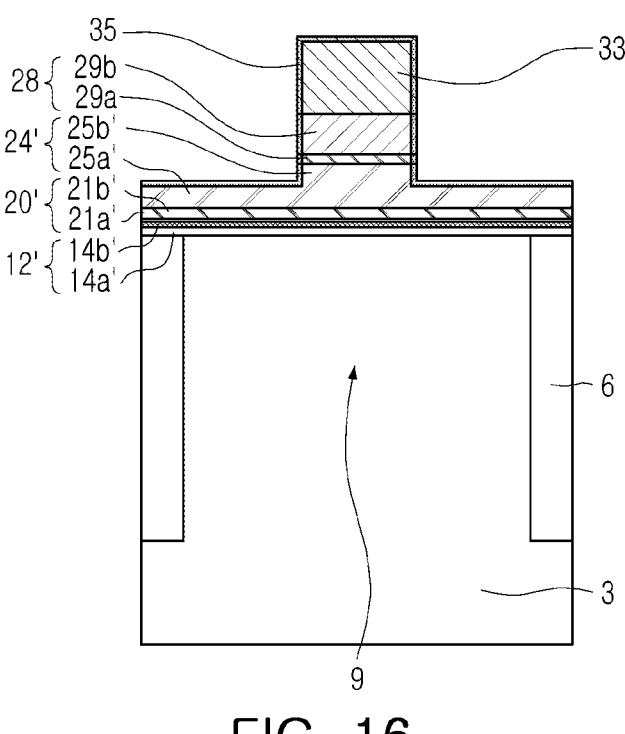

Referring to FIGS. 14 and 16, the upper conductive layer 28' and at least a portion of the intermediate conductive layer 24' may be etched by an etching process using the gate capping pattern 33 as an etching mask to sequentially form the upper conductive pattern 28 and the intermediate conductive pattern 24 (S50). In an example, the intermediate conductive pattern 24 formed by etching a portion of the intermediate conductive layer 24' may include a first intermediate portion 25*a*' and a second intermediate portion 25*b*' disposed on the first intermediate portion 25*a*'. In another example, the entire intermediate conductive layer 24' may be etched to form the intermediate conductive pattern 24 defined below the upper conductive pattern 28.

A protective layer 35 may be formed, e.g., conformally, on exposed surfaces of the intermediate conductive pattern 24, the upper conductive pattern 28, and the gate capping pattern 33 (S60). The protective layer 35 may be formed to include two or more different materials depending on types of materials of the intermediate conductive pattern 24, the upper conductive pattern 28, and the gate capping pattern 33. The different materials of the protective layer 35 may be the materials of the protective layer 36 (see FIG. 1) described with reference to FIG. 1.

For example, forming of the protective layer 35 may include performing a plasma nitridation process on the exposed surfaces of the intermediate conductive pattern 24, the upper conductive pattern 28, and the gate capping pattern 33. In another example, forming of the protective layer 35 may include performing a thermal oxidation process or a plasma oxidation process on the exposed surfaces of the intermediate conductive pattern 24, the upper conductive pattern 28, and the gate capping pattern 33. In yet another example embodiment, forming of the protective layer 35 may include sequentially performing a nitridation process and an oxidation process on the exposed surfaces of the intermediate conductive pattern 24, the upper conductive pattern 28, and the gate capping pattern 33. For example, forming of the protective layer 35 may include first nitriding the upper conductive pattern 28 that may be formed of a metal to form a metal nitride, and then selectively oxidizing the intermediate conductive pattern 24 that may be formed of polysilicon to form a silicon oxide, by using a partial pressure ratio of nitrogen ($N_2$) and oxygen ($O_2$).

Figure 17:
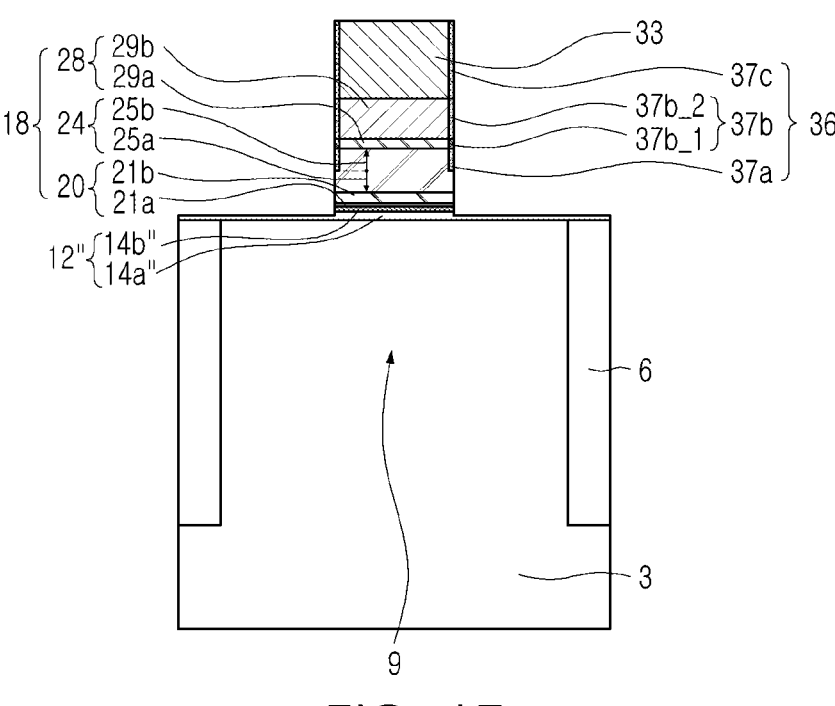

Referring to FIGS. 14 and 17, the protective layer 35 may be etched to form a protective pattern (S70). Here, the protective pattern may be the protective layer 36 described with reference to FIG. 1. The protective pattern formed by etching the protective layer 35 will hereinafter be described as the "protective layer 36" denoted by reference numeral 36. Accordingly, the protective layer 36 may include the first to third protective portions 37*a*, 37*b*, and 37*c* as described with reference to FIG. 1.

The lower conductive layer 20' and at least a portion of the gate dielectric layer 12' may be etched by an etching process using the gate capping pattern 33 and the protective layer 36 as an etch mask to sequentially form the lower conductive pattern 20 and the gate dielectric layer 12' (S80). In this process, when a portion of the intermediate conductive layer 24' is etched as described above with reference to FIG. 16, the first intermediate portion 25*a*' (see FIG. 16) of the intermediate conductive layer 24' may be etched. Accordingly, the intermediate conductive pattern 24 as described with reference to FIG. 1 may be formed. Accordingly, the gate electrode 18 as described with reference to FIG. 1 may be formed.

In an example embodiment, the protective layer 36 may serve to protect the upper conductive pattern 28 from the etching process of etching the lower conductive layer 20'. Accordingly, the protective layer 36 may prevent a volume of the upper conductive pattern 28 having excellent electrical characteristics from being decreased by preventing a side surface of the upper conductive pattern 28 from being recessed by the etching process of etching the lower conductive layer 20' (see FIG. 16) in order to form the lower conductive pattern 20 (see FIG. 17). Accordingly, deterioration of electrical characteristics of the gate electrode 18 may be prevented.

Figure 18:
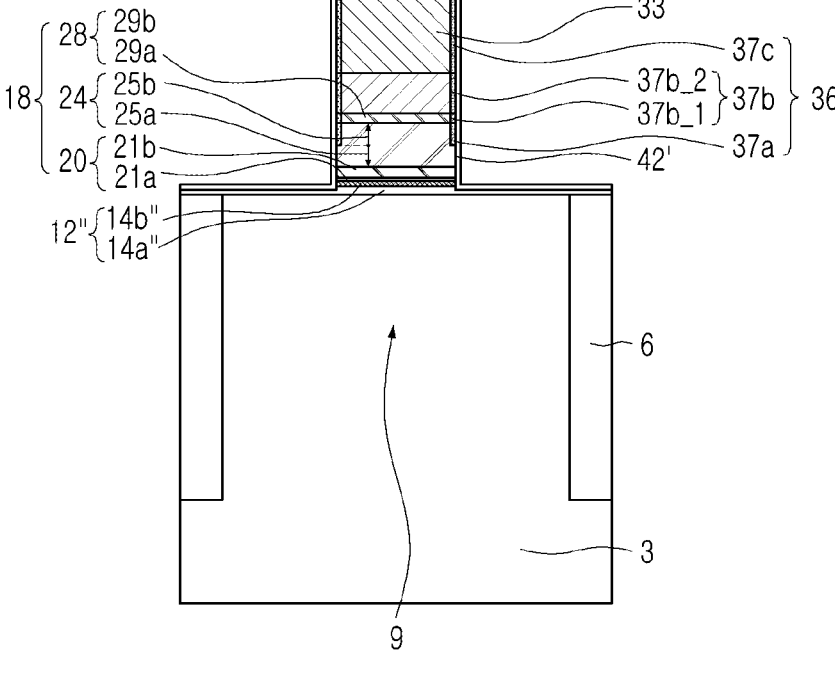

Referring to FIGS. 14 and 18, the first spacer liner 42' may be conformally formed. The first spacer liner 42' may conformally cover at least the gate electrode 18 and the gate capping pattern 33. The first spacer liner 42' may cover the protective layer 36 covering a portion of a side surface of the gate electrode 18.

Figure 19:
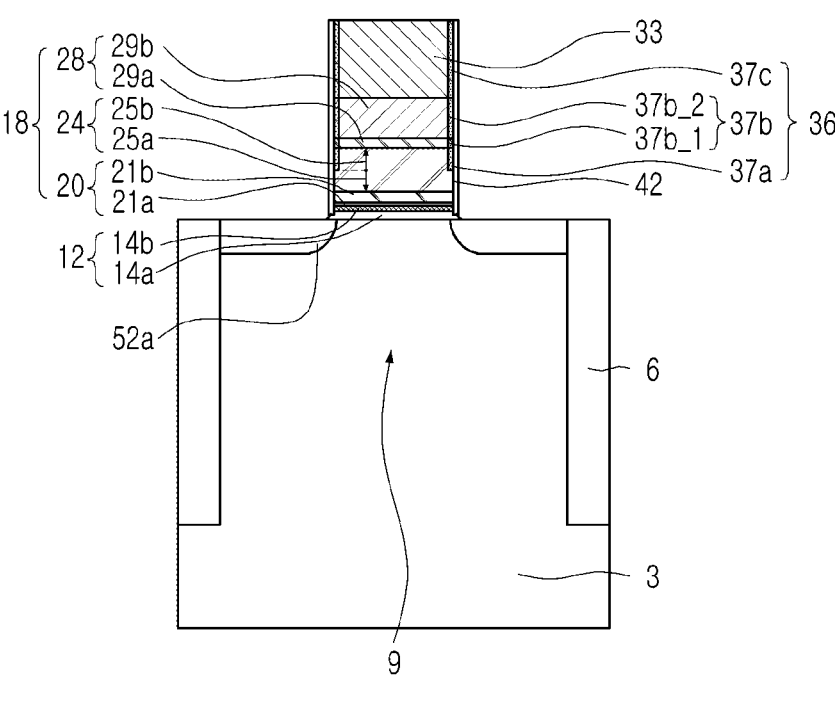

Referring to FIGS. 14 and 19, the first spacer liner 42' may be etched to form the first spacer layer 42 as described with reference to FIG. 1. An unetched portion of the gate dielectric layer 12' may be etched while the first spacer liner 42' is etched. Accordingly, the gate dielectric pattern 12 including the lower and upper dielectric layers 14*a* and 14*b* as described with reference to FIG. 1 may be formed. Low-concentration impurity regions 52*a* may be formed in the active region 9 by performing a low-concentration ion implantation process.

Figure 20:
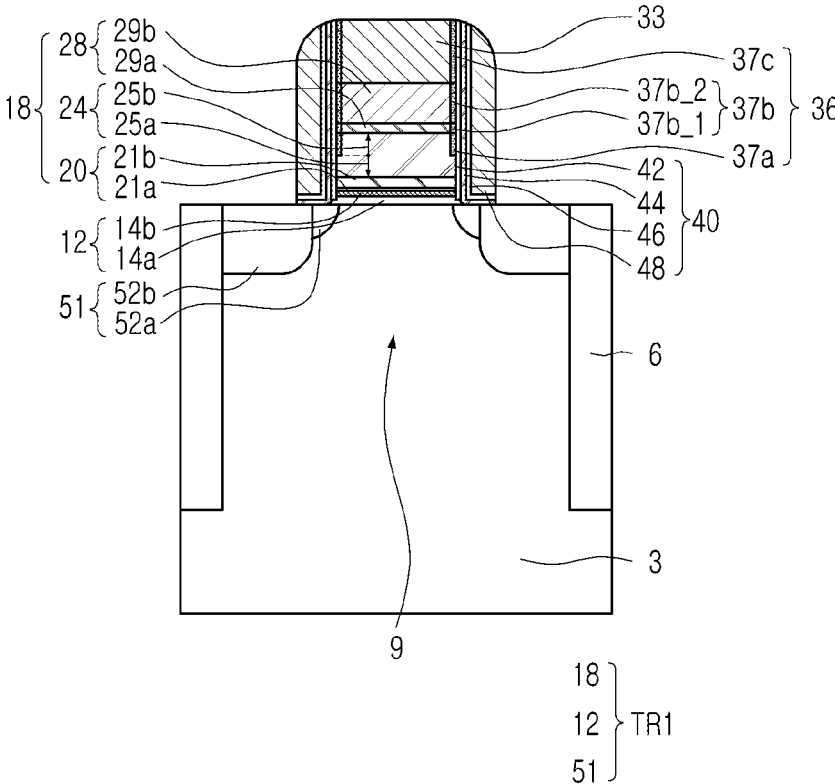

Referring to FIGS. 14 and 20, a second spacer liner, a third spacer liner, and a fourth spacer liner may be sequentially formed and then anisotropically etched to form the second to fourth spacer layers 44, 46, and 48 as described with reference to FIG. 1. Accordingly, the spacer structure 40 as described in FIG. 1 may be formed (S90).

High-concentration impurity regions 52*b* may be formed in the active region 9 by performing a high-concentration ion implantation process. Accordingly, source/drain regions 51 including the low-concentration impurity regions 52*a* and the high-concentration impurity regions 52*b* may be formed.

Referring to FIG. 1 again, the insulating liner 55 may be conformally formed on the substrate 3 formed up to the source/drain regions 51, the interlayer insulating layer 60 may be formed on the insulating liner 55, and the upper capping insulating layer 63 may be formed on the insulating liner 55 and the interlayer insulating layer 60. The contact structures 66 sequentially penetrating through the upper capping insulating layer 63, the interlayer insulating layer 60, and the insulating liner 55 and electrically connected to the source/drain regions 51 and the wiring patterns 69 disposed on the contact structures 66 may be formed.

In the above-described example embodiments, the protective layer 36 as illustrated in FIG. 1 or the protective layers in the modified examples may serve to protect the side surface of the upper conductive pattern 28 from the etching process of etching the lower conductive layer 20' as described with reference to FIG. 16. Accordingly, the protective layer 36 may prevent the volume of the upper conductive pattern 28 having excellent electrical characteristics from being decreased by preventing the side surface of the upper conductive pattern 28, particularly, the second upper conductive layer 29b, from being recessed by the etching process of etching the lower conductive layer 20' in FIG. 16. Accordingly, as described above, the protective layer 36 may prevent deterioration of electrical characteristics of the gate electrode 18 including the lower conductive pattern 20 serving as the work function control layer, the intermediate conductive pattern 24 that may be formed of polysilicon having the N-type conductivity, and the upper conductive pattern 28 including the second upper conductive layer 29b having low resistivity like tungsten etc., and may thus improve electrical characteristics of the transistor TR1.

By way of summation and review, example embodiments provide a semiconductor device capable of having improved electrical characteristics. That is, according to example embodiments, the gate electrode including the lower conductive pattern serving as the work function control layer, the intermediate conductive pattern that may be formed of the polysilicon having the N-type conductivity, and the upper conductive pattern including a material layer having low resistivity like tungsten etc., and the protective layer covering a portion of the gate electrode may be provided. In the protective layer, a material of a portion covering the entire side surface of the upper conductive pattern and a material of a portion covering at least a portion of a side surface of the intermediate conductive pattern may be different from each other. Such a protective layer may serve to protect the side surface of the upper conductive pattern from an etching process for forming the lower conductive pattern while being in contact with the entire side surface of the upper conductive pattern and at least a portion of the side surface of the intermediate conductive pattern. Accordingly, the protective layer may improve electrical characteristics of the transistor including the gate electrode by protecting the upper conductive pattern including the material layer having the low resistivity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
an active region;
a gate dielectric layer on the active region;
a gate electrode on the gate dielectric layer, the gate electrode including:
a lower conductive pattern on the gate dielectric layer,
an intermediate conductive pattern on the lower conductive pattern, and
an upper conductive pattern on the intermediate conductive pattern;

a protective layer in contact with a portion of a side surface of the gate electrode, the protective layer including:
a first protective portion in contact with at least a portion of a side surface of the intermediate conductive pattern and
a second protective portion in contact with a side surface of the upper conductive pattern,
wherein:
the first protective portion includes silicon nitride and the second protective portion includes a metal nitride;
the first protective portion includes silicon oxide, and the second protective portion includes a metal oxide, a metal nitride, or a metal oxynitride, or
the first protective portion includes silicon oxynitride, and the second protective portion includes a metal oxide, a metal nitride, or a metal oxynitride, and wherein the second protective portion includes a material different from a material of the first protective portion; and
a spacer structure covering the side surface of the gate electrode and the protective layer.

2. The semiconductor device as claimed in claim 1, wherein:
the lower conductive pattern includes a first conductive material,
the intermediate conductive pattern includes polysilicon, and
the upper conductive pattern includes a second conductive material different from each of the first conductive material and the polysilicon.

3. The semiconductor device as claimed in claim 1, wherein:
the lower conductive pattern includes at least two conductive layers, and
the upper conductive pattern includes a first upper conductive layer and a second upper conductive layer on the first upper conductive layer.

4. The semiconductor device as claimed in claim 3, wherein the first upper conductive layer includes a titanium silicon nitride layer, and the second upper conductive layer includes a tungsten layer.

5. The semiconductor device as claimed in claim 4, wherein the second protective portion includes:
an oxidized side surface of the first upper conductive layer having a titanium silicon oxynitride; and
an oxidized side surface of the second upper conductive layer having a tungsten oxide.

6. The semiconductor device as claimed in claim 5, wherein the intermediate conductive pattern includes polysilicon, and the first protective portion includes a silicon oxide.

7. The semiconductor device as claimed in claim 3, wherein the second protective portion includes a metal nitride on the side surface of the upper conductive pattern, the metal nitride including a tungsten nitride.

8. The semiconductor device as claimed in claim 7, wherein the intermediate conductive pattern includes polysilicon, and the first protective portion includes a silicon nitride.

9. The semiconductor device as claimed in claim 1, wherein the spacer structure includes:
a first spacer layer covering the side surface of the gate electrode and the protective layer;
a second spacer layer on the first spacer layer;
a third spacer layer on the second spacer layer; and a fourth spacer layer on the third spacer layer, materials of the first spacer layer and the third spacer layer being different from materials of the second spacer layer and the fourth spacer layer.

10. The semiconductor device as claimed in claim 9, wherein:

the first spacer layer is in contact with the protective layer, the second spacer layer includes a first vertical portion in contact with the first spacer layer and a first horizontal portion extending from a lower end portion of the first vertical portion, the third spacer layer includes a second vertical portion in contact with the first vertical portion and a second horizontal portion extending from a lower end portion of the second vertical portion and in contact with the first horizontal portion, and the fourth spacer layer is in contact with the second horizontal portion and the second vertical portion and on the second horizontal portion.

11. The semiconductor device as claimed in claim 10, wherein:

the gate dielectric layer includes a lower gate dielectric layer and an upper gate dielectric layer on the lower gate dielectric layer, the upper gate dielectric layer includes a high-K dielectric having a higher dielectric constant than the lower gate dielectric layer, and a lower end of the first spacer layer is at a lower level than an upper surface of the lower gate dielectric layer, and is at a higher level than a lower surface of the lower gate dielectric layer.

12. The semiconductor device as claimed in claim 1, wherein an upper surface of the active region includes a first upper surface positioned on a first height level below the gate electrode and a second upper surface positioned on a second height level lower than the first height level below the spacer structure.

13. A semiconductor device, comprising:

a substrate;

an isolation layer defining a first active region and a second active region on the substrate;

a first gate dielectric layer on the first active region;

a second gate dielectric layer on the second active region;

a first gate electrode on the first gate dielectric layer;

a second gate electrode on the second gate dielectric layer;

a first source/drain region in the first active region on at least one side of the first gate electrode and having N-type conductivity;

a second source/drain region in the second active region on at least one side of the second gate electrode and having P-type conductivity;

an N-channel metal oxide semiconductor (NMOS) gate protective layer in contact with a portion of a side surface of the first gate electrode;

a P-channel metal oxide semiconductor (PMOS) gate protective layer in contact with a portion of a side surface of the second gate electrode;

a first spacer structure covering the side surface of the first gate electrode and the NMOS gate protective layer; and a second spacer structure covering the side surface of the second gate electrode and the PMOS gate protective layer, wherein the first gate electrode includes:

a first lower conductive pattern on the first gate dielectric layer;

a first intermediate conductive pattern on the first lower conductive pattern; and a first upper conductive pattern on the first intermediate conductive pattern, wherein the second gate electrode includes:

a second lower conductive pattern on the second gate dielectric layer;

a second intermediate conductive pattern on the second lower conductive pattern; and a second upper conductive pattern on the second intermediate conductive pattern, wherein the NMOS gate protective layer includes a first NMOS protective portion in contact with at least a portion of a side surface of the first intermediate conductive pattern and a second NMOS protective portion in contact with a side surface of the first upper conductive pattern, wherein the PMOS gate protective layer includes a first PMOS protective portion in contact with at least a portion of a side surface of the second intermediate conductive pattern and a second PMOS protective portion in contact with a side surface of the second upper conductive pattern, wherein the first lower conductive pattern includes an NMOS work function control layer, wherein the second lower conductive pattern includes a PMOS work function control layer different from the NMOS work function control layer, wherein the first intermediate conductive pattern and the second intermediate conductive pattern include a polysilicon layer, wherein the first upper conductive pattern and the second upper conductive pattern include the same metal layer, and wherein a material of the first NMOS protective portion and the first PMOS protective portion is different from a material of the second NMOS protective portion and the second PMOS protective portion.

14. The semiconductor device as claimed in claim 13, wherein:

the material of the first NMOS protective portion and the first PMOS protective portion includes a silicon oxide, and the material of the second NMOS protective portion and the second PMOS protective portion includes a metal oxide, a metal nitride, or a metal oxynitride.

15. The semiconductor device as claimed in claim 13, wherein:

the material of the first NMOS protective portion and the first PMOS protective portion includes a silicon nitride, and the material of the second NMOS protective portion and the second PMOS protective portion includes a metal nitride.

16. The semiconductor device as claimed in claim 13, wherein the polysilicon layer of the first intermediate conductive pattern and the second intermediate conductive pattern has N-type conductivity.

17. A semiconductor device, comprising:

a substrate;

an isolation layer defining a cell active region on a memory cell area of the substrate and defining a peripheral active region on a peripheral circuit area of the substrate;

a cell gate structure buried in the cell active region and extending into the isolation layer;

a bit line structure on the cell active region and the isolation layer and electrically connected to a first cell source/drain region in the cell active region;

a cell contact structure on the cell active region and electrically connected to a second cell source/drain region in the cell active region;

a peripheral gate dielectric layer on the peripheral active region;

a peripheral gate electrode on the peripheral gate dielectric layer;

a peripheral gate capping pattern on the peripheral gate electrode;

a peripheral source/drain region in the peripheral active region on at least one side of the peripheral gate electrode;

a protective layer in contact with at least a portion of a side surface of the peripheral gate electrode;

a peripheral spacer structure covering the side surface of the peripheral gate electrode and the protective layer; and a peripheral contact structure on the peripheral source/drain region, wherein the peripheral gate electrode includes:

a peripheral lower conductive pattern on the peripheral gate dielectric layer;

a peripheral intermediate conductive pattern on the peripheral lower conductive pattern; and a peripheral upper conductive pattern on the peripheral intermediate conductive pattern, wherein the protective layer includes a first protective portion in contact with at least a portion of a side surface of the peripheral intermediate conductive pattern and a second protective portion in contact with a side surface of the peripheral upper conductive pattern, and wherein the second protective portion includes a material different from a material of the first protective portion.

18. The semiconductor device as claimed in claim 17, wherein:

the bit line structure includes a bit line including a first layer, a second layer on the first layer, and a third layer on the second layer, the peripheral upper conductive pattern includes a first upper conductive layer and a second upper conductive layer on the first upper conductive layer, the peripheral lower conductive pattern includes a first conductive material, the first layer and the peripheral intermediate conductive pattern include polysilicon having N-type conductivity, the second layer and the first upper conductive layer include a same second conductive material, the third layer and the second upper conductive layer include a same third conductive material, and resistivity of the third conductive material is lower than resistivity of the first conductive material and the second conductive material.

* * * * *